(12) United States Patent
Yano et al.

(10) Patent No.: US 9,830,900 B2
(45) Date of Patent: Nov. 28, 2017

(54) ADAPTIVE EQUALIZER, ACOUSTIC ECHO CANCELLER DEVICE, AND ACTIVE NOISE CONTROL DEVICE

(75) Inventors: Atsuyoshi Yano, Tokyo (JP);
Tomoharu Awano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 276 days.

(21) Appl. No.: 13/984,136

(22) PCT Filed: Mar. 29, 2012

(86) PCT No.: PCT/JP2012/002193
§ 371 (c)(1),
(2), (4) Date: Aug. 7, 2013

(87) PCT Pub. No.: WO2012/153451
PCT Pub. Date: Nov. 15, 2012

(65) Prior Publication Data
US 2013/0315408 A1 Nov. 28, 2013

(30) Foreign Application Priority Data
May 10, 2011 (JP) .................. 2011-105343

(51) Int. Cl.
*H03G 5/16* (2006.01)
*H04B 3/23* (2006.01)
(Continued)

(52) U.S. Cl.
CPC .......... *G10K 11/175* (2013.01); *G10K 11/178* (2013.01); *H03G 5/165* (2013.01); *H04B 3/235* (2013.01); *H04R 3/02* (2013.01)

(58) Field of Classification Search
USPC ...... 381/71.1, 71.3, 71.4, 71.6, 71.11, 71.12, 381/66, 103
See application file for complete search history.

(56) References Cited

U.S. PATENT DOCUMENTS 6,490,007 B1 12/2002 Bouillet et al.
6,654,412 B1 * 11/2003 Chen .................. H03H 21/0012
370/290
(Continued)

FOREIGN PATENT DOCUMENTS

EP 1 978 649 10/2008
JP 09-148965 * 6/1997
(Continued)

OTHER PUBLICATIONS

Office Action dated Aug. 26, 2014 in Chinese Patent Application No. 201280013679.7 (with English translation).
(Continued)

*Primary Examiner* — Duc Nguyen
*Assistant Examiner* — Yogeshkumar Patel
(74) *Attorney, Agent, or Firm* — Oblon, McClelland, Maier & Neustadt, L.L.P.

(57) ABSTRACT

A variable update step size is determined in proportion to a magnitude ratio or magnitude difference between a first residual signal and a second residual signal. The first residual signal is obtained by using adaptive filter coefficient sequence, where the adaptive filter coefficient sequence has been obtained in previous operations of the adaptive equalizer. The second residual signal is obtained by using a prior update adaptive filter coefficient sequence, where the prior update adaptive filter coefficient sequence is obtained by performing a coefficient update with an arbitrary prior update step size on the adaptive filter coefficient sequence having been obtained in previous operations of the adaptive equalizer.

20 Claims, 13 Drawing Sheets

(51) Int. Cl.
*H04R 3/02* (2006.01)
*G10K 11/175* (2006.01)
*G10K 11/178* (2006.01)
*H04M 9/08* (2006.01)
*H03H 21/00* (2006.01)

(56) References Cited

U.S. PATENT DOCUMENTS

| | | | | |
|---|---|---|---|---|
| 2001/0048740 | A1* | 12/2001 | Zhang | G10L 21/0208 379/406.01 |
| 2006/0013412 | A1* | 1/2006 | Goldin | H04R 3/005 381/94.1 |
| 2006/0098766 | A1* | 5/2006 | Pietraski et al. | 375/346 |
| 2007/0071253 | A1* | 3/2007 | Sato | G10L 21/0208 381/94.3 |
| 2008/0247536 | A1 | 10/2008 | Rahbar | |
| 2010/0246851 | A1* | 9/2010 | Buck | G10L 21/0208 381/94.1 |

FOREIGN PATENT DOCUMENTS

| | | | |
|---|---|---|---|
| JP | 09/148965 | * | 6/1997 |
| JP | 9 148965 | | 6/1997 |
| JP | 2891295 B2 | | 5/1999 |
| JP | 2001 320304 | | 11/2001 |
| JP | 2003 332951 | | 11/2003 |
| JP | 2008/042816 | * | 2/2008 |
| JP | 2008 312199 | | 12/2008 |
| WO | WO 2010/027722 A1 | | 3/2010 |

OTHER PUBLICATIONS

Valin, J.M. "On Adjusting the Learning Rate in Frequency Domain Echo Cancellation With Double-Talk", IEEE Transactions on Audio, Speech, and Language Processing, vol. 15 No. 3 pp. 1030-1034, (Mar. 2007).

Haykin, S. "Adaptive Filter Theory", Kagaku gijutsu Shuppan, translated by Hiroshi Suzuki et al, pp. 500-514, (Jan. 10, 2001).

International Search Report dated Apr. 24, 2012 in PCT/JP12/002193 Filed Mar. 29, 2012.

Extended European Search Report dated Jun. 19, 2015 in Patent Application No. 12781653.6.

Muhammad Tahir Akhtar, et al., "Modified-Filtered-x LMS Algorithm Based Active Noise Control Systems with Improved Online Secondary-Path Modeling" The 47th IEEE International Midwest Symposium on Circuits and Systems, vol. 1, XP10738634A, Jul. 25, 2004, pp. 1-13-1-16.

Office Action dated Oct. 13, 2016 in European Patent Application No. 12 781 653.6.

* cited by examiner

ADAPTIVE EQUALIZER, ACOUSTIC ECHO CANCELLER DEVICE, AND ACTIVE NOISE CONTROL DEVICE

TECHNICAL FIELD

The present invention relates to an adaptive equalizer used for learning identification of an unknown system, and also relates to an acoustic echo canceller device and an active noise control device each of which uses the adaptive equalizer.

BACKGROUND ART

An adaptive equalizer or adaptive filter is utilized to identify, from an input signal to a target unknown system and a response signal therefrom, a transfer function of the unknown system by an adaptive algorithm, and is extensively used in various signal processing systems.

For example, an echo canceller is used to identify the transfer function of an echo path and thereby predict an echo signal from a signal which is the source of echo, and cancel the echo signal. In addition, an active noise control device is used to identify the transfer function of a noise path and thereby predict incoming noise from an acoustic signal of a noise source, and generate an acoustic signal opposite in phase to the noise and thereby cancel out the noise.

A factor of blocking identification of the unknown system by the adaptive equalizer includes a disturbance mixed in a response signal from the unknown system to be observed. For example, in the case of the echo canceller, background noise or near-end speaker's voice which is superimposed on echo becomes disturbance to the adaptive equalizer in terms of performing identification of an echo path, and reduces performance of the echo canceller (particularly, a phenomenon in which a near-end speaker's voice and echo are superimposed on each other on a signal is called double-talk).

In addition, when such an equalizer is provided in an active noise control device, sound other than target noise may become disturbances. For example, in the case of canceling out noise of a blast fan in a blast duct, sound other than that of the blast fan picked up by an error detection microphone provided in the duct (e.g. operating sound of other mechanical devices, voice of a person nearby, etc.) becomes a disturbance to an adaptive equalizer in terms of performing identification of a noise path. Such noise may become a factor of reducing the noise reduction effect.

In general, as measures against such disturbances, a method of adjusting the update speed of the filter coefficients of an adaptive equalizer by providing a predetermined update step size is employed. In this case, the update formula for the filter coefficients of the adaptive equalizer can be represented as a formula (1) shown below:

$$\hat{h}(n+1) = \hat{h}(n) + \mu \varepsilon(n) \quad (1)$$

where $\hat{h}(n)$ is the filter coefficients of the adaptive equalizer and is represented by the following formula (2):

$$\hat{h}(n) = [h_0(n), h_1(n), \ldots, h_{N-1}(n)]^T \quad (2)$$

In formula (2), "N" indicates a filter order, and "n" is a subscript representing time series. When n=0 at the initial time point, the coefficient sequence in formula (2) is given some initial values. Furthermore, "$\mu$" represents an update step size and "$\varepsilon(n)$" represents the amount of update to the filter coefficients given by a predetermined adaptive algorithm. As an example of $\varepsilon(n)$, when the NLMS (Normalized Least Mean Squares) algorithm which is commonly well known is used, $\varepsilon(n)$ is represented by the following formula (3):

$$\varepsilon(n) = \frac{d(n)x(n)}{N\sigma_x^2} \quad (3)$$

Note that "x(n)" is an input signal and is represented by the following formula (4):

$$x(n) = [x(n), x(n-1), \ldots, x(n-N+1)]^T \quad (4)$$

In addition, $\sigma_x^2$ represents the variance of the input signal x(n) to the unknown system. Note that in the actual computation, approximately, the following formula (5) is often set up:

$$N\sigma_x^2 \approx x^T(n)x(n) \quad (5)$$

The right side of formula (5) is the signal power of the input signal x(n), and "d(n)" is the residual signal obtained using the filter coefficients before an update.

In formula (1), by setting the update step size $\mu$ to a smaller value, the speed of a coefficient update can be retarded, and thereby the influence of disturbances can be reduced. As a result, the convergence value of identification error (i.e. error in filter coefficients) can be made smaller. On the other hand, since a coefficient update becomes slow, for example, when starting from an initial state or immediately after the transfer function of the unknown system is changed, a larger number of updates is required before the identification error converges. Hence, the update step size $\mu$ needs to be set such that convergence characteristics according to a purpose can be obtained.

It is often the case that the update step size $\mu$ is set to a constant, but the update step size $\mu$ can also be changed according to the situation. For example, Patent Document 1 shown later proposes an echo canceller that changes an update step size $\mu$ so as to always converge to required identification error regardless of the disturbance condition.

However, in the echo canceller described in Patent Document 1, since the update step size $\mu$ is determined according to the required value of identification error, the echo canceller has the property that the update step size $\mu$ also increases or decreases in accordance with magnitude of the required value. As a result, the smaller the desired identification error, the smaller the value of the update step size $\mu$. By this, a coefficient update becomes slow and thus a larger number of updates are required for convergence of identification error, causing a problem that an update takes time.

In addition, Non-Patent Document 1 shown later suggests that an update step size value $\mu_{opt}$ that reduces identification error to a minimum is approximately represented by the following formula (6):

$$\mu_{opt} \approx \frac{\sigma_e^2}{\sigma_d^2} \quad (6)$$

where $\sigma_d^2$ represents the variance of a residual signal of the adaptive equalizer including a disturbance, and $\sigma_e^2$ represents the variance of an error signal in which the disturbance is removed from the residual signal. When a variance of the disturbance is represented by $\sigma_v^2$, the above-mentioned $\sigma_d^2$ is represented by the following formula (7):

$$\sigma_d^2 = \sigma_e^2 + \sigma_v^2 \quad (7)$$

However, although $\sigma_d^2$ are unknown and thus cannot be directly observed, $\sigma_v^2$ and $\sigma_e^2$ are unknown and cannot be observed directly. Therefore, $\mu_{opt}$ cannot be directly obtained from the above-described formula (6). Hence, Non-Patent Document 1 proposes a method in which a time-varying cross-correlation value between the power of an estimated response signal of an unknown system by an adaptive equalizer and the power of a residual signal is determined for each frequency component, and the ratio in power between the estimated response signal and the residual signal is multiplied by the cross-correlation value, thereby determining the estimated value of $\mu_{opt}$.

However, in general, a signal with a sufficient length is required to accurately observe a correlation value. In particular, it is difficult to accurately observe a momentary cross-correlation value for an nonstationary signal such as sound. Therefore, in the method disclosed in Non-Patent Document 1, due to error in observed cross-correlation value, accurate $\mu_{opt}$ cannot be obtained, and an update step size which is a bit higher or lower than the accurate $\mu_{opt}$ is calculated, causing a problem that identification error cannot be reduced rapidly or to a sufficiently small level.

PRIOR ART DOCUMENT

Patent Document

[Patent Document 1] JP 2008-312199 A

Non-Patent Document

[Non-Patent Document 1] J. M. Valin, "On Adjusting the Learning Rate in Frequency Domain Echo Cancellation With Double-Talk", IEEE Trans. on Audio, Speech, And Language Processing, Vol. 15, NO. 3, pp. 1030-1034, March 2007

SUMMARY OF INVENTION

As described above, in the conventional art, since the update step size value is determined according to the required value of identification error, as the required identification error decreases, the number of updates to filter coefficients required to converge the identification error increases. Therefore, there is a problem that it takes long time to convergence of the identification error. In addition, since the update step size value is determined according to the cross-correlation value between an estimated response signal and a residual signal, an optimal update step size value is not set due to observation error in cross-correlation value. Therefore, there is a further problem that identification error cannot be reduced rapidly or to a sufficient level.

Such problems may cause inconvenience that, for instance, in the echo canceller, the transfer function of an echo path cannot be identified rapidly or sufficiently accurately, and thus, a sufficient echo cancellation effect cannot be obtained. Likewise, in the active noise control device, the transfer function of noise cannot be identified rapidly or accurately, causing a problem that a sufficient noise suppression effect cannot be obtained.

The present invention has been made to solve problems such as those described above, and an object of the present invention is to determine, in conditions where a disturbance or a transfer function of an unknown system or a change thereof cannot be predicted beforehand, a variable update step size according to the conditions without additionally using a means for observing or detecting them.

An adaptive equalizer according to the present invention generates an output signal by performing a filtering process on an input signal using an adaptive filter coefficient sequence having been subjected to a coefficient update process using a variable update step size which is determined based on a magnitude ratio or magnitude difference between: a first residual signal obtained by using adaptive filter coefficient sequence having been obtained in previous operations; and a second residual signal obtained by using a prior update adaptive filter coefficient sequence obtained by performing a coefficient update with an arbitrary prior update step size on the adaptive filter coefficient sequence having been obtained in previous operations.

According to the present invention, identification error can be rapidly reduced to a sufficiently small level.

DESCRIPTION OF EMBODIMENTS

To describe the present invention in more detail, embodiments for implementing the present invention will be described below with reference to the accompanying drawings.

Embodiment 1

Figure 1:
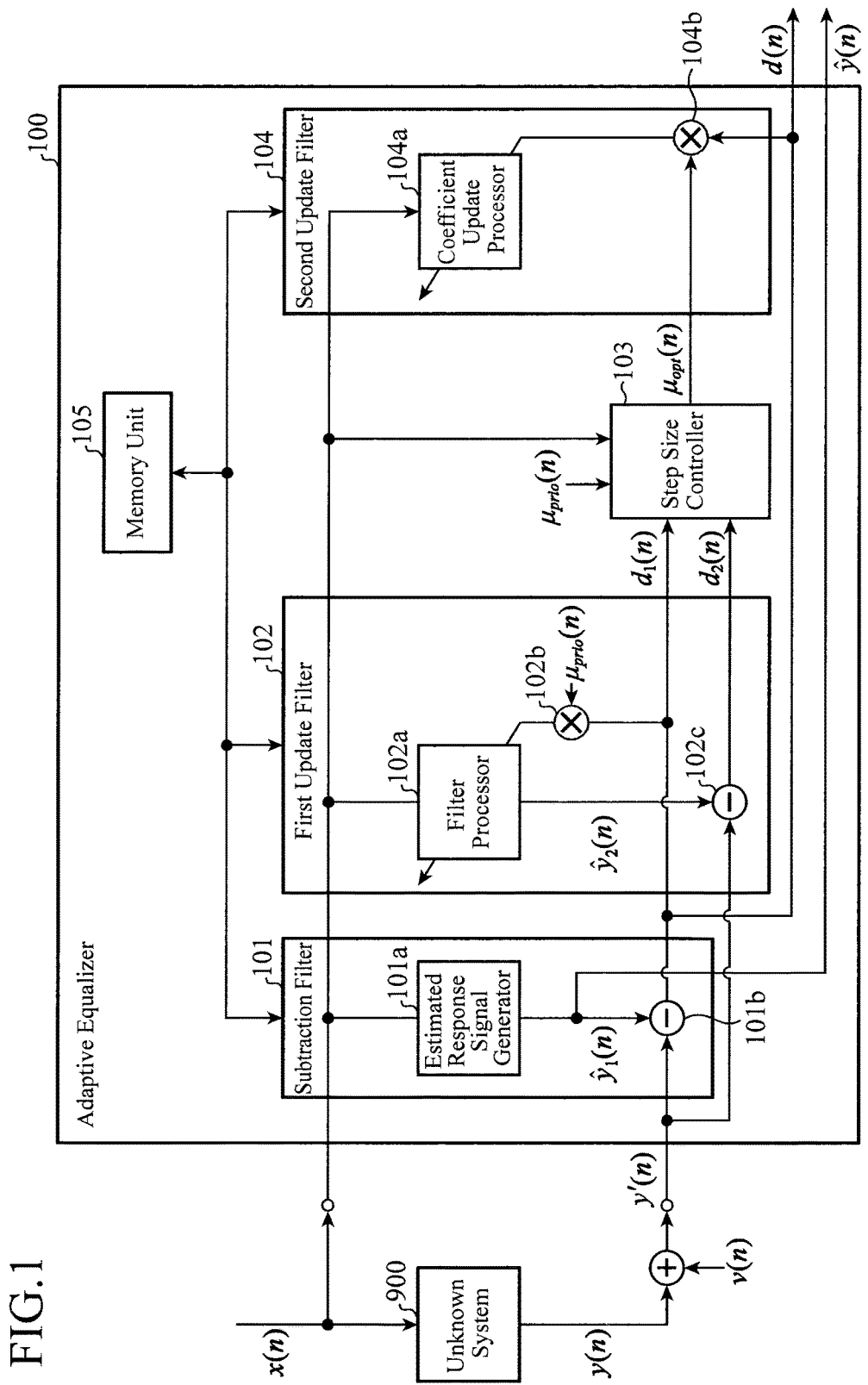
FIG. 1 is a block diagram showing a configuration of an adaptive equalizer according to Embodiment 1.

FIG. 1 is a block diagram showing a configuration of an adaptive equalizer according to Embodiment 1 of the present invention. In FIG. 1, an adaptive equalizer 100 is composed of: a subtraction filter 101 that generates a first estimated response signal and a first residual signal; a first update filter 102 that performs a coefficient update on a filter coefficient sequence and generates a second estimated response signal using the updated filter coefficient sequence; a step size controller 103 that determines a variable update step size; a second update filter 104 that performs a coefficient update on the filter coefficient sequence; and a memory unit 105 that stores the filter coefficient sequence. The subtraction filter 101 includes an estimated response signal generator 101a and a subtractor 101b. The first update filter 102 includes a filter processor 102a, a multiplier 102b, and a subtractor 102c. The second update filter 104 includes a coefficient update processor 104a and a multiplier 104b.

As shown in FIG. 1, the adaptive equalizer 100 is connected to an unknown system 900. The unknown system 900 is a system serving as a learning identification target of the adaptive equalizer 100.

An outline of the adaptive equalizer 100 will be described.

When an input signal x(n) is given to the unknown system 900, the unknown system 900 outputs a response signal y(n) against the input signal x(n). The response signal y(n) has an unknown disturbance v(n) mixed therein and becomes an observed response signal y'(n). The observed response signal y'(n) is represented by the following formula (8):

$$y'(n)=y(n)+v(n) \quad (8)$$

The input signal x(n) and the observed response signal y'(n) are given to the adaptive equalizer 100. The adaptive equalizer 100 identifies a transfer function of the unknown system 900 by using the two signals x(n) and y'(n). The adaptive equalizer 100 outputs an output estimated response signal ŷ(n) obtained by estimating the response signal of the unknown system, and also outputs an output residual signal d(n) obtained by subtracting the output estimated response signal ŷ(n) from the observed response signal y'(n).

Figure 2:
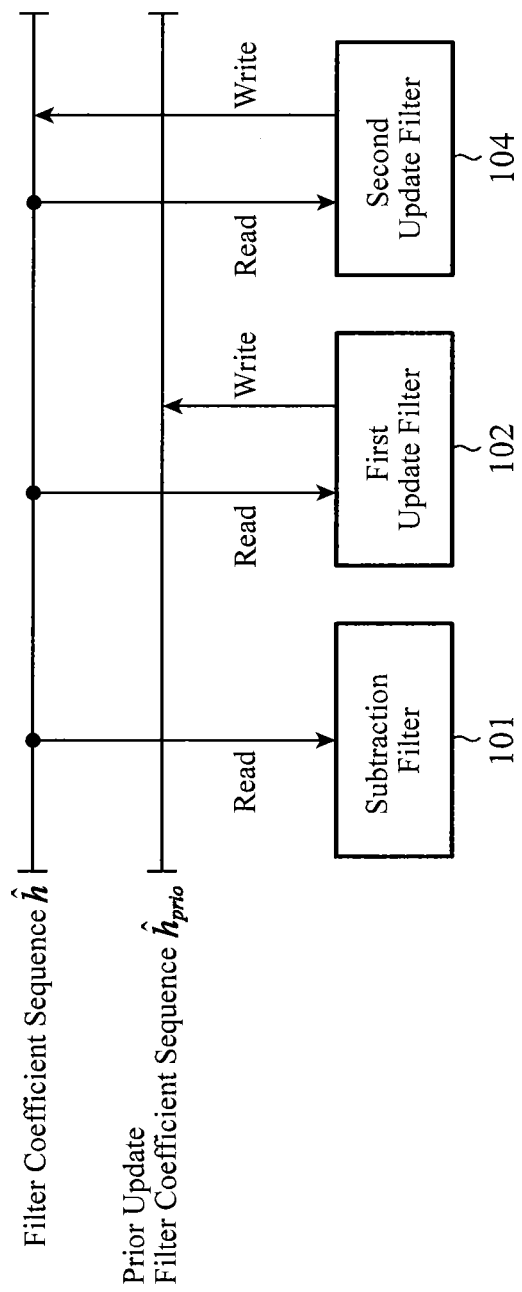
FIG. 2 is an illustrative diagram showing the process of reading/writing filter coefficient sequences of the adaptive equalizer according to Embodiment 1.

Next, the operation of the adaptive equalizer according to Embodiment 1 will be described. FIG. 2 is an illustrative diagram schematically showing the process of reading or writing filter coefficient sequences of the adaptive equalizer according to Embodiment 1.

The subtraction filter 101 reads from the memory unit 105 a filter coefficient sequence ĥ(n) which is obtained in previous operations, and performs a filtering process on an input signal x(n) using the read filter coefficient sequence ĥ(n), and thereby generates a first estimated response signal ŷ₁(n). Furthermore, by subtracting the generated first estimated response signal ŷ₁(n) from an observed response signal y'(n), a first residual signal d₁(n) is obtained. Here, for the case of n=0 as the initial time point, some initial values are set to a filter coefficient sequence ĥ(0) stored in the memory unit 105. The first estimated response signal ŷ₁(n) and the first residual signal d₁(n) which are obtained by the subtraction filter 101 are output from the adaptive equalizer 100 as an output estimated response signal ŷ(n) and an output residual signal d(n), respectively.

The first update filter 102 performs a coefficient update by a predetermined adaptive algorithm by using the input signal x(n), the first residual signal d₁(n), and a prior step size $\mu_{prio}(n)$ which is determined arbitrarily. The first update filter 102 obtains a prior update filter coefficient sequence $\hat{h}_{prio}(n)$ as shown in the following formula (9):

$$\hat{h}_{prio}(n)=\hat{h}(n)+\mu_{prio}(n)\epsilon(n) \quad (9)$$

Note that the filter coefficient sequence ĥ(n) used for the coefficient update is read from the memory unit 105, and the calculated prior update filter coefficient sequence $\hat{h}_{prio}(n)$ is written into the memory unit 105. The prior update step size $\mu_{prio}(n)$ may be a fixed value or a value that is changed each time by a predetermined means.

The first update filter 102 further performs a filtering process on the input signal x(n) by using the prior update filter coefficient sequence $\hat{h}_{prio}(n)$ which has been obtained by the coefficient update in the above-described formula (9), and thereby generates a second estimated response signal ŷ₂(n). Furthermore, by subtracting the generated second estimated response signal ŷ₂(n) from the observed response signal y'(n), a second residual signal d₂(n) is obtained.

The step size controller 103 determines a variable update step size $\mu_{opt}(n)$ on a basis of the first residual signal d₁(n), the second residual signal d₂(n), and the prior update step size $\mu_{prio}(n)$. A detail of how to determine the variable update step size $\mu_{opt}(n)$ will be described later.

The second update filter 104 performs a coefficient update by a predetermined adaptive algorithm by using the variable update step size $\mu_{opt}(n)$, the input signal x(n), and the first residual signal d₁(n), and thereby obtains an updated filter coefficient sequence ĥ(n+1) (see the following formula (10)):

$$\hat{h}(n+1)=\hat{h}(n)+\mu_{opt}(n)\epsilon(n) \quad (10)$$

Note that the filter coefficient sequence ĥ(n) used for the coefficient update is read from the memory unit 105, and the calculated filter coefficient sequence ĥ(n+1) is written into the memory unit 105. The above is the description of the operation of the adaptive equalizer 100 of Embodiment 1.

Next, the method of calculating a variable update step size $\mu_{opt}(n)$ by the step size controller 103 will be described in detail. In the present invention, the variable update step size $\mu_{opt}(n)$ is defined as "an update step size that reduces identification error to a minimum in a disturbance condition and a convergence state" at each time point. The present invention is characterized by having a configuration for securely obtaining the above-defined variable update step size at each coefficient update. For describing the configuration, derivation of the variable update step size $\mu_{opt}(n)$ will be described below.

Now, given that the transfer function of the unknown system is "h", identification error δ(n) is defined as shown in the following formula (11):

$$\delta(n)=\hat{h}(n)-h \quad (11)$$

On assuming that an update of the filter coefficients is made once based on the above-described formula (11), identification error δ(n+1) is represented by the following formula (12):

$$\delta(n+1) = \hat{h}(n+1) - h$$
$$= \delta(n) + \mu\varepsilon(n) \quad (12)$$

When the magnitude of the identification error is represented by the sum of squared error in each tap of each filter coefficient, the difference in identification error for a single coefficient update is shown by the following formula (13):

$$\Delta(n+1) = \delta^T(n+1)\delta(n+1) - \delta^T(n)\delta(n)$$
$$= \mu^2\varepsilon^T(n)\varepsilon(n) + 2\mu\delta^T(n)\varepsilon(n) \quad (13)$$

Hereafter, description is made using, as an example, the case of using the NLMS algorithm. Note that it does not mean that the present invention is limited to NLMS. Other adaptive algorithms can also be used in the present invention, and such a case is also included in the adaptive equalizer of the present invention.

In the case of using the NLMS algorithm, the above-described formula (13) is rewritten as the following formula (14):

$$\Delta(n+1) = \mu^2 \frac{d^2(n)}{(N\sigma_x^2)^2} x^T(n)x(n) + 2\mu \frac{d(n)}{N\sigma_x^2} \delta^T(n)x(n) \quad (14)$$

$$= \mu^2 \frac{d^2(n)}{(N\sigma_x^2)^2} x^T(n)x(n) - 2\mu \frac{(e(n)+v(n))e(n)}{N\sigma_x^2}$$

where $e(n)$ is the error signal in which a disturbance $v(n)$ is removed from a residual signal $d(n)$. This is represented as shown in the following formula (15) from identification error $\delta(n)$ and an input signal $x(n)$:

$$e(n) = -\delta^T(n)x(n) \quad (15)$$

Considering that the input signal $x(n)$ and the disturbance $v(n)$ are generally uncorrelated and independent, the expected value of formula (14) can be approximated as shown in the following formula (16):

$$E[\Delta(n+1)] \approx \mu^2 \frac{\sigma_d^2}{N\sigma_x^2} - 2\mu \frac{\sigma_e^2}{N\sigma_x^2} \quad (16)$$

Formula (16) indicates that the magnitude difference between identification errors obtained before and after the coefficient update is a quadratic function of the update step size $\mu$. Formula (16) indicates that the identification error decreases when the right side of this formula has a negative value. Therefore, the update step size $\mu$ that gives the minimum value of the right side of formula (16) is the "update step size $\mu_{opt}$ that reduces identification error to a minimum in a disturbance condition and a convergence state", and this is given by the following formula (17):

$$\mu_{opt} = \underset{\mu}{\operatorname{argmin}} E[\Delta(n+1)] \quad (17)$$

$$= \frac{\sigma_e^2}{\sigma_d^2}$$

Formula (17) coincides with the optimal value of the update step size suggested in Non-Patent Document 1. However, as already described, since $\sigma_e^2$ in formula (17) cannot be observed, the optimal value $\mu_{opt}$ cannot be directly obtained from formula (17) and such a method is not disclosed in Non-Patent Document 1. In contrast, according to the adaptive equalizer 100 of the present invention, the value of $\mu_{opt}$ in formula (17) can be securely obtained. This will be described next.

Now, it is assumed that a single coefficient update has been performed by using an arbitrary update step size $\mu$. The variance difference between residual signals using filter coefficients obtained before and after the coefficient update can be approximated by the difference $\Delta(n+1)$ between the sums of squares of identification error and the power $N\sigma_x^2$ of the input signal $x(n)$, and is shown by the following formula (18):

$$\sigma_{d'}^2(\mu) - \sigma_d^2 \approx E[\Delta(n+1)] \cdot N\sigma_x^2 \quad (18)$$

$$= \mu^2 \sigma_d^2 - 2\mu\sigma_e^2$$

where $\sigma_{d'}^2(\mu)$ is the variance of the residual signal using the filter coefficients obtained after performing the coefficient update using the update step size $\mu$. Assuming that different coefficient updates are performed using different arbitrary update step sizes $\mu_1$ and $\mu_2$, a difference between the variance $\sigma_{d'}^2(\mu_1)$ and $\sigma_{d'}^2(\mu_2)$ of residual signals by using the update step sizes $\mu_1$ and $\mu_2$ is taken by the following formula (19):

$$\sigma_{d'}^2(\mu_1) - \sigma_{d'}^2(\mu_2) = (\mu_1^2 - \mu_2^2)\sigma_d^2 - 2(\mu_1 - \mu_2)\sigma_e^2 \quad (19)$$

By transforming formula (19), the following formula (20) is derived:

$$\mu_{opt} = \frac{\sigma_e^2}{\sigma_d^2} \quad (20)$$

$$= \frac{1}{2}(\mu_1 + \mu_2) - \frac{1}{2(\mu_1 - \mu_2)} \frac{\sigma_{d'}^2(\mu_1) - \sigma_{d'}^2(\mu_2)}{\sigma_d^2}$$

Formula (20) can be further simplified by setting either one of $\mu_1$ and $\mu_2$ to 0, resulting in the following formula (21):

$$\mu_{opt} = \frac{1}{2}\mu + \frac{1}{2\mu}\left(1 - \frac{\sigma_{d'}^2(\mu)}{\sigma_d^2}\right) \quad (21)$$

Formula (21) indicates that the "update step size $\mu_{opt}$ that reduces identification error to a minimum in a disturbance condition and a convergence state" can be obtained by observing each of the variance $\sigma_d^2(\mu)$ of the residual signal using a filter coefficient sequence at the stage before performing a coefficient update and the variance $\sigma_{d'}^2(\mu)$ of the residual signal using filter coefficients sequences obtained by a coefficient update performed based on an arbitrary update step size $\mu$.

Therefore, the step size controller 103 of Embodiment 1 calculates, for each time point n, a variable update step size $\mu_{opt}(n)$ represented by the following formula (22), from a first residual signal $d_1(n)$, a second residual signal $d_2(n)$, and a prior update step size $\mu_{prio}(n)$:

$$\mu_{opt}(n) = \frac{1}{2}\mu_{prio}(n) + \frac{1}{2\mu_{prio}(n)}\left(1 - \frac{\sigma_{d2}^2(n)}{\sigma_{d1}^2(n)}\right) \quad (22)$$

where $\sigma_{d1}^2(n)$ is the variance of the first residual signal $d_1(n)$ and $\sigma_{d2}^2(n)$ is the variance of the second residual signal $d_2(n)$, and they are statistical values representing the magnitudes of the respective signals. Note that the adaptive equalizer 100 of the present invention is not limited to always using precise variance values in calculation of the variable update step size $\mu_{opt}(n)$, and may use the amounts of statistics equivalent thereto. The above-described formula (22) is further generalized to the following formula (23):

$$\mu_{opt}(n) = \frac{1}{2}\mu_{prio}(n) + \frac{1}{2\mu_{prio}(n)}\left(1 - \frac{P(d_2(n))}{P(d_1(n))}\right) \quad (23)$$

Here, $p_1$ is the function representing the magnitude of the first residual signal $d_1(n)$ and $p_2$ is the function representing the magnitude of the second residual signal $d_2(n)$, and average signal power, a leak integral, etc., such as those shown below can be applied. In measurement of variance by these methods, even if the signal length is limited, accuracy can be relatively expected compared to measurement of a correlation, etc.

(Average Signal Power)

$$P_e(d(n)) = \frac{1}{L}\sum_{i=0}^{L-1}|d(n-i)|^2 \qquad (24)$$

(Leak Integral)

$$I(n) = \alpha \cdot I(d(n-1)) + (1-\alpha)|d(n)|^2 \qquad (25)$$

where $0 < \alpha < 1$.

Furthermore, formula (23) can be calculated with simplifying it such as shown in the following formula (26) by setting the prior update step size $\mu_{prio}(n)$ to 1:

$$\mu_{opt}(n) = 1 - \frac{1}{2}\frac{P(d_2(n))}{P(d_1(n))} \qquad (26)$$

By using the variable update step size $\mu_{opt}(n)$ obtained in the second update filter 104, the second update filter 104 can securely calculate each time the "update step size that reduces identification error to a minimum in a disturbance condition and a convergence state" at each time point and perform a coefficient update. As a result, the adaptive equalizer 100 which rapidly reduces identification error and whose convergence value of identification error is sufficiently small can be obtained.

According to formula (16), the update step size $\mu$ that reduces identification error is in a range where the right side of formula (16) has a negative value. Therefore, by using an update step size $\mu'_{opt}(n)$ that satisfies the above-mentioned range, at least a reduction in identification error can be expected. This range is represented as shown in the following formula (27):

$$0 < \mu'_{opt}(n) < 2\mu_{opt}(n) \qquad (27)$$

If only a reduction in identification error is expected, a quasi-variable update step size $\mu'_{opt}(n)$ set to any of the values in the range represented by formula (26) based on the first residual signal $d_1(n)$, the second residual signal $d_2(n)$, and the prior update step size $\mu_{prio}(n)$ by a predetermined procedure may be used in the second update filter 104. The adaptive equalizer of the present invention also includes such a case.

Figure 3:
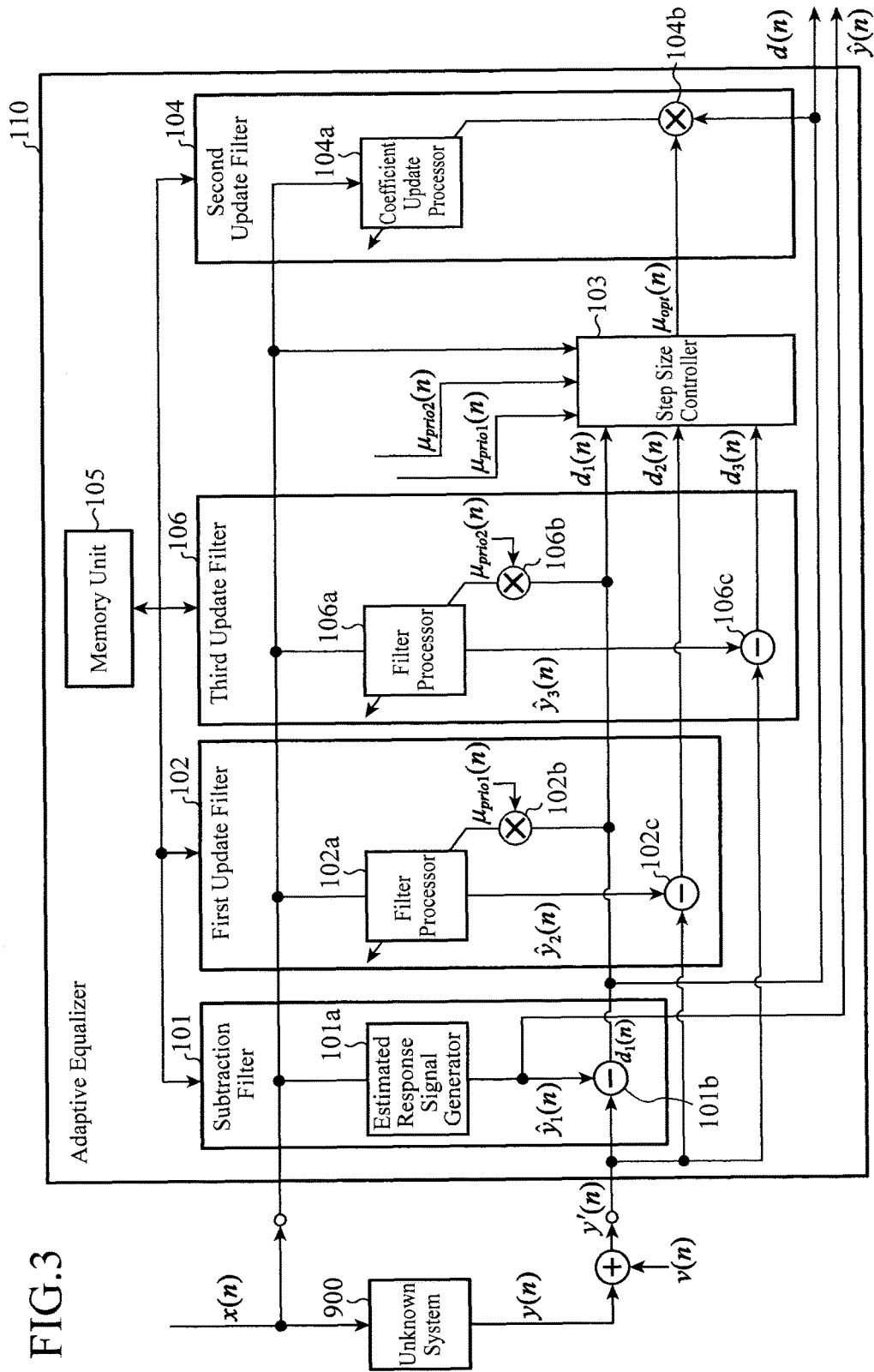
FIG. 3 is a block diagram showing another configuration of the adaptive equalizer according to Embodiment 1.

Next, another exemplary configuration of the adaptive equalizer 100 is shown. FIG. 3 is a block diagram showing another exemplary configuration of the adaptive equalizer of Embodiment 1. An adaptive equalizer 110 of FIG. 3 is such that a third update filter 106 is additionally provided to the adaptive equalizer 100 shown in FIG. 1. Note that the same components as those of the adaptive equalizer 100 shown in FIG. 1 are denoted by the same reference characters and description thereof is omitted.

The third update filter 106 includes a filter processor 106a, a multiplier 106b, and a subtractor 106c, and the operation thereof is the same as that of a first update filter 102. It is assumed that the first update filter 102 and the third update filter 106 uses a first prior update step size a $\mu_{prio1}(n)$ and a second prior update step size $\mu_{prio2}(n)$ respectively. By additionally providing the third update filter 106, three residual signals, i.e., a first residual signal $d_1(n)$ from a subtraction filter 101, a second residual signal $d_2(n)$ from the first update filter 102, and a third residual signal $d_3(n)$ from the third update filter 106, are input to a step size controller 103.

The step size controller 103 determines a variable update step size $\mu_{opt}(n)$ through the following formula (28) by using any two residual signals $d_A(n)$ and $d_B(n)$ among the three residual signals, the first residual signal $d_1(n)$, the second residual signal $d_2(n)$, and the third residual signal $d_3(n)$, and any two parameters $\mu_A$ and $\mu_B$ among three different parameters, the first prior update step size $\mu_{prio1}(n)$, the second prior update step size $\mu_{prio2}(n)$, and "0":

$$\mu_{opt}(n) = \frac{1}{2}(\mu_A + \mu_B) - \frac{1}{2(\mu_A - \mu_B)}\frac{P(d_A(n)) - P(d_B(n))}{P(d_1(n))} \qquad (28)$$

Specific combinations of the two residual signals $d_A(n)$ and $d_B(n)$ and the two parameters $\mu_A$ and $\mu_B$ in formula (28) are shown below.

Pattern 1:
$d_A(n) = d_2(n)$, $d_B(n) = d_1(n)$, $\mu_A = \mu_{prio1}(n)$, and $\mu_B = 0$ Pattern 2:
$d_A(n) = d_3(n)$, $d_B(n) = d_2(n)$, $\mu_A(n)$, and $\mu_B = \mu_{prio1}(n)$ Pattern 3:
$d_A(n) = d_3(n)$, $d_B(n) = d_1(n)$, $\mu_A = \mu_{prio2}(n)$, and $\mu_B = 0$ The step size controller 103 may use, as a final variable update step size $\mu_{opt}(n)$, any of a variable update step size $\mu_{opt1}(n)$ calculated by pattern 1, a variable update step size $\mu_{opt2}(n)$ calculated by pattern 2, and a variable update step size $\mu_{opt3}(n)$ calculated by pattern 3. Alternatively, the step size controller 103 may calculate an average value of the calculated three variable update step sizes and use the calculated average value as a final variable update step size $\mu_{opt}(n)$.

By providing the step size controller 103 that thus calculates an average value of a plurality of variable update step sizes using a plurality of (three or more) residual signals, as a variable update step size $\mu_{opt}(n)$ which is the final result, a variable update step size $\mu_{opt}(n)$ with high accuracy can be obtained.

In FIG. 3, the configuration in which the third update filter 106 is additionally provided and a first residual signal $d_1(n)$, a second residual signal $d_2(n)$, and a third residual signal $d_3(n)$ are input to the step size controller 103. Alternatively, the number of update filters to be added and the number "d" of residual signals to be input to the step size controller 103 can be appropriately changed.

Description has been made so far using the NLMS algorithm as an example. Examples of a variable update step size $\mu_{opt}(n)$ for the case of using the LMS algorithm and the affine projection algorithm as an adaptive algorithm in the adaptive equalizers 100 and 110 of the present invention are also described below.

LMS algorithm:
(Variable Update Step Size)

$$\mu_{opt}(n) = \frac{1}{2}\mu_{prio}(n) + \frac{1}{2\mu_{prio}(n)(N\sigma_x^2(n))^2}\left(1 - \frac{P(d_2(n))}{P(d_1(n))}\right) \qquad (29)$$

(Filter Coefficient Update Formula)

$$\hat{h}(n+1) = \hat{h}(n) + \mu_{opt}(n)d(n)x(n) \qquad (30)$$

Affine Projection Algorithm:
(Variable Update Step Size)

$$\mu_{opt}(n) = \frac{1}{2}\mu_{prio}(n) - \frac{1}{2\mu_{prio}(n)N\sigma_x^2(n)}\frac{P(d_2(n)) - P(d_1(n))}{d_p^T(n)[X_p^T(n)X_p(n)]^{-1}d_p(n)} \qquad (31)$$

(Filter Coefficient Update Formula)

$$\hat{h}(n+1)=\hat{h}(n)+\mu_{opt}(n)X_p(n)[X_p^T(n)X_p(n)]^{-1}d_p(n) \quad (32)$$

where p is the projection order, and
$X_p(n)=[x(n), x(n-1), \ldots, x(n-p+1)]$
$d_p(n)=[d_1(n), d_1(n-1), \ldots, d_1(n-p+1)]^T$ Those formula (29) and formula (31) can be derived by the same derivation process as that of the above-described example of NLMS. As shown in those formulae, when the LMS algorithm or the affine projection algorithm is used, the step size controller 103 also requires an input signal x(n) as information for calculating a variable update step size $\mu_{opt}(n)$.

In addition, the adaptive equalizers 100 and 110 may be configured using a block adaptive filter algorithm, such as BLMS (Block LMS) or BOP (Block Orthogonal Projection Algorithm), in which the LMS algorithm or the affine projection algorithm is performed on a predetermined signal block basis. In the case of using those block adaptive filter algorithms, the step size controller 103 can analyze, for a first residual signal $d_1(n)$ and a second residual signal $d_2(n)$, a signal having the fixed block length and thus an improvement in the measurement accuracy of variance of the signals can be expected. By this, obtainment of a more accurate variable update step size can be expected. The adaptive equalizers of the present invention also include the case in which the adaptive equalizers are configured in any of the above-described examples.

FIGS. 4(a) and (b) are graphs showing examples of identification error convergence characteristics of the adaptive equalizers of Embodiment 1.

In FIG. 4(a), identification error is represented by a value obtained by normalizing the sum of squared error of coefficients by the sum of square values of the filter coefficients of the transfer function of the unknown system 900.

Figure 4:
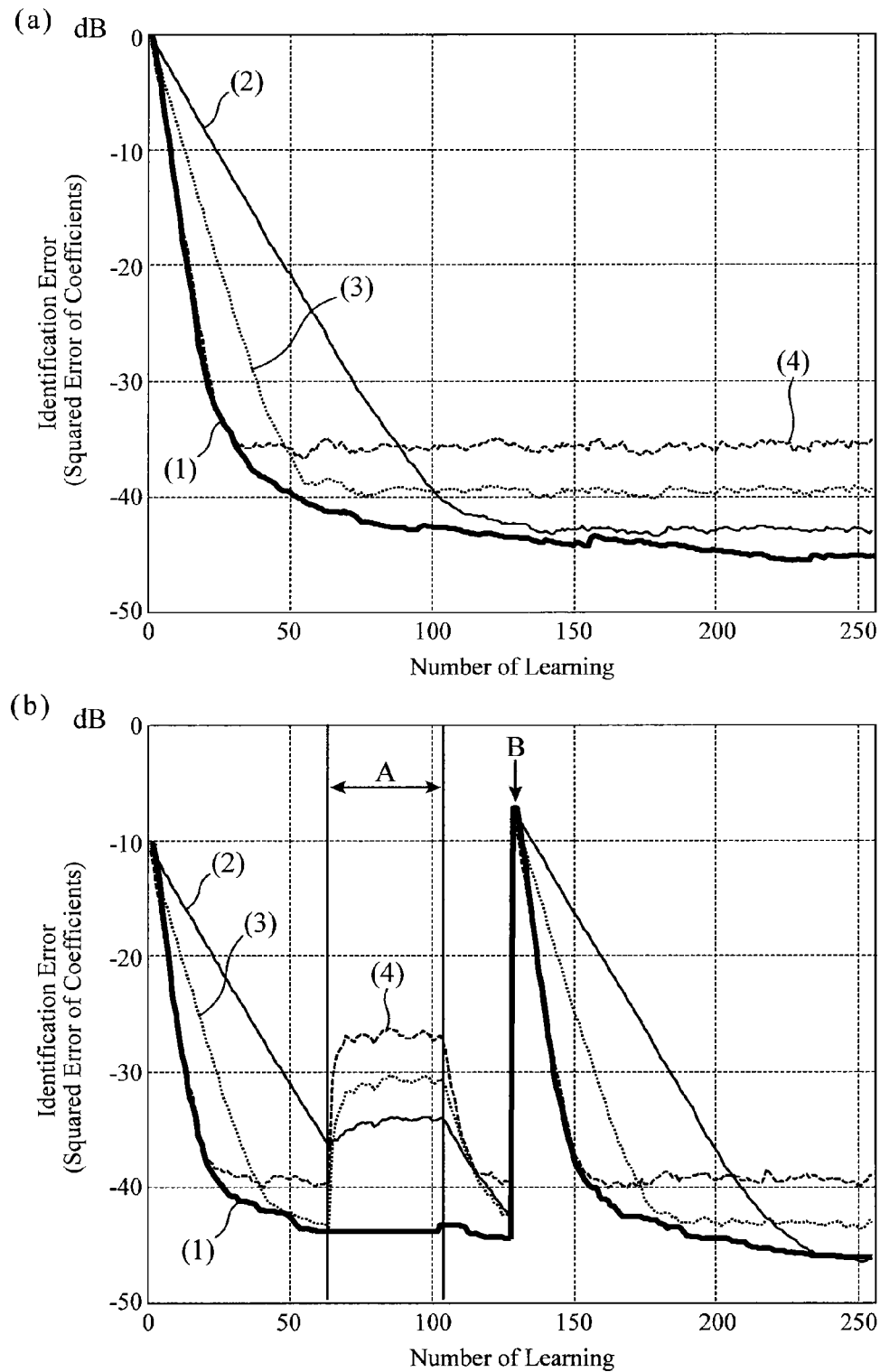
FIGS. 4(a) and (b) are graphs showing examples of identification error convergence characteristics of the adaptive equalizers according to Embodiment 1.

A convergence characteristic curve (1) in FIG. 4 represents a convergence characteristic for the case in which the adaptive equalizers 100 and 110 of Embodiment 1 use a variable update step size $\mu_{opt}(n)$ which is determined based on the above-described formula (22). A convergence characteristic curve (2) represents a convergence characteristic for the case in which the update step size is set to a fixed value of 0.05. A convergence characteristic curve (3) represents a convergence characteristic for the case in which the update step size is set to a fixed value of 0.1. A convergence characteristic curve (4) represents a convergence characteristic for the case in which the update step size is set to a fixed value of 0.2. Note that the disturbance condition is constant and white noise with a constant level is applied to an observed response signal.

As is clear from the graph shown in FIG. 4(a), it can be seen that the adaptive equalizers 100 and 110 of Embodiment 1 have the effects of rapidly reducing the identification error and converging the identification error to a small value, over the case of using any of the fixed values for the update step size.

In contrast, FIG. 4(b) shows an example of identification error convergence characteristics for when a change in disturbance and a change in the unknown system 900 occur. The numbers attached to the convergence characteristic curves on the graph shown in FIG. 4(b) are the same as those in FIG. 4(a).

In the example of FIG. 4(b), constant white noise which is the same as that in FIG. 4(a) is applied as a disturbance, and in section A a bit larger white noise than that in other sections is further applied as a sudden disturbance change. In addition, at point B, a change in the unknown system 900 is assumed and the transfer function of the unknown system 900 is momentarily changed to a completely different one.

As is clear from the graph shown in FIG. 4(b), it can be seen that in section A, while the identification error increases due to the sudden disturbance change in the case of using a fixed value of 0.05 to 0.2 for the update step size, the convergence characteristic curve (1) of the adaptive equalizers 100 and 110 maintains a convergence state without increasing the error. Furthermore, it can be seen that there is an effect that after point B where the transfer function of the unknown system 900 is suddenly changed, the convergence characteristic curve (1) of the adaptive equalizers 100 and 110 of Embodiment 1 reduces the error most rapidly among any other curve. It is noted that in any of the above-described examples, a configuration is not provided in which switching between execution and stopping of a coefficient update is performed according to the disturbance condition, or a change in the unknown system is detected and another adaptation of the adaptive equalizer is promoted.

The characteristics of the adaptive equalizers 100 and 110 according to Embodiment 1 which are shown in FIGS. 4(a) and (b) mean that, for example, an echo canceller can rapidly identify the transfer function of an echo path without being influenced by disturbances such as background noise and a speaker's voice, and effectively cancel echo. In addition, they also mean that when the echo path is changed, the change can be rapidly followed.

As described above, according to Embodiment 1, the configuration includes the step size controller 103 that calculates, every time a filter coefficient sequence is updated, a variable update step size $\mu_{opt}(n)$ that reduces identification error to a minimum in a disturbance condition and a convergence state at each time point; and the second update filter 104 that performs a coefficient update using the variable update step size $\mu_{opt}(n)$ calculated by the step size controller 103, and updates the filter coefficient sequence. Therefore, identification error can be rapidly reduced to a sufficiently small level. Furthermore, without additionally providing a configuration that detects a disturbance signal or a configuration that estimates the detected disturbance signal, even when a disturbance change which is difficult to detect occurs, there is an effect that the convergence state is not deteriorated. Furthermore, without additionally providing a configuration that detects a change in the transfer function of the unknown system 900, even when the convergence state is reset as a result of a change in the unknown system 900, identification error can rapidly converge by an update to the filter coefficient sequence.

In addition, according to Embodiment 1, the update step size controller 103 is configured to calculate a variable update step size $\mu_{opt}(n)$ using a first residual signal $d_1(n)$, a second residual signal $d_2(n)$, and a prior update step size $\mu_{prio}(n)$. Thus, compared to the case in which the prior update step size is fixed at "1", a breakdown of a learning system as a result of divergence of error in calculation of a variable update step size can be suppressed.

In addition, according to Embodiment 1, since the configuration also allows block adaptive filter algorithms which perform a coefficient update on a predetermined block length basis, such as BLMS and BOP, to be applicable, a sufficient signal length for observation of variance of a first residual signal $d_1(n)$ and a second residual signal $d_2(n)$ can be obtained and thus a variable update step size $\mu_{opt}(n)$ with high accuracy can be calculated, enabling to more efficiently make an update to a filter coefficient sequence.

In addition, according to Embodiment 1, since the configuration is such that a quasi-variable update step size μ'_{opt}(n) having a predetermined range is determined, the safety of an update to a filter coefficient sequence can be increased. In addition, settings that meet user's intentions can be performed, e.g., when there is a demand to suppress a disturbance, the variable update step size μ_{opt}(n) is set to a small value within the predetermined range, or when there is a demand to increase a convergence effect, the variable update step size μ_{opt}(n) is set to a large value within the predetermined range.

Embodiment 2

In the above-described Embodiment 1, the configuration is shown in which after a variable update step size μ_{opt}(n) is calculated, the calculated variable update step size μ_{opt}(n) is applied to a second update filter 104 to perform a coefficient update on a filter coefficient sequence. However, when a change in disturbance condition or in the transfer function of an unknown system 900 is relatively small, there may be a case in which there is no great difference in value between a variable update step size μ_{opt}(n−1) calculated last time and the latest variable update step size μ_{opt}(n). For example, when a disturbance is white noise or pink noise that has constant statistical properties or a random signal similar thereto, it can be assumed that a change in disturbance is sufficiently small with respect to the frequency of updates to coefficients. Thus, it is expected that there is almost no change in the value of a variable update step size to be calculated between the last one and the latest one. In such a case, the validity of a variable update step size μ_{opt}(n−1) calculated last time can be expected also at the next time point (n). Hence, in this Embodiment 2, a configuration is shown in which as a prior update step size μ_{prio}(n), a variable update step size μ_{opt}(n−1) obtained in the last operation is used.

By providing the configuration of Embodiment 2, it is also possible to allow a first update filter 102 shown in Embodiment 1 to perform the function of the second update filter 104 in place of the second update filter 104. By this, the configuration of an adaptive equalizer can be more simplified.

Figure 5:
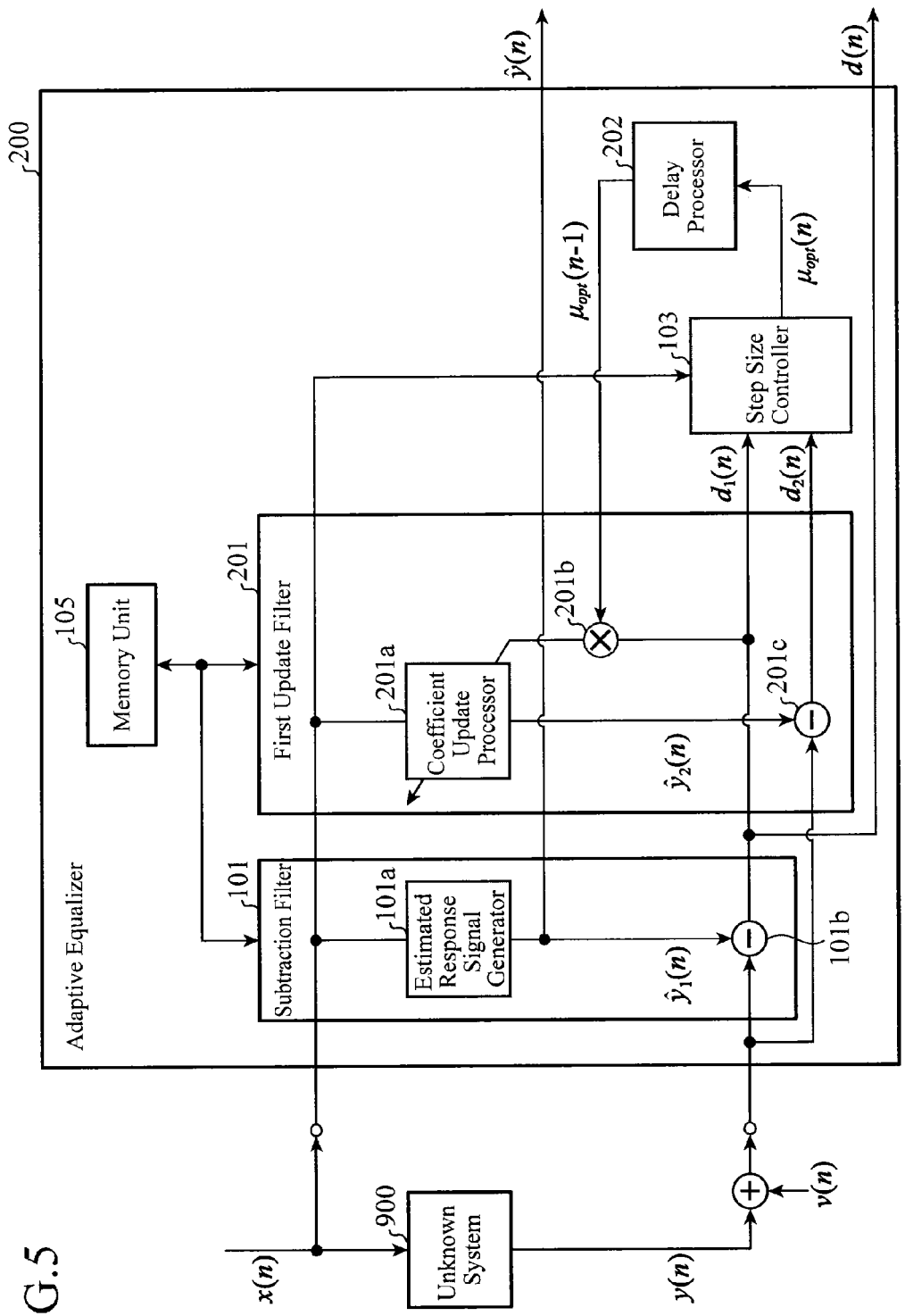
FIG. 5 is a block diagram showing a configuration of an adaptive equalizer according to Embodiment 2.

FIG. 5 is a block diagram showing a configuration of an adaptive equalizer according to Embodiment 2.

In FIG. 5, an adaptive equalizer 200 is composed of a subtraction filter 101 that generates a first estimated response signal and a first residual signal; a first update filter 201 that performs a coefficient update on a filter coefficient sequence and generates a second estimated response signal using the updated filter coefficient sequence; a step size controller 103 that determines a variable update step size; a delay processor 202 that provides a variable update step size obtained in the last operation to the first update filter 201; and a memory unit 105 that stores the filter coefficient sequence. Furthermore, the subtraction filter 101 includes an estimated response signal generator 101a and a subtractor 101b, and the first update filter 201 includes a coefficient update processor 201a, a multiplier 201b, and a subtractor 201c. In addition, the adaptive equalizer 200 is connected to an unknown system 900. Note that the same components as those of the adaptive equalizer 100 of Embodiment 1 shown in FIG. 1 are denoted by the same reference characters and description thereof is omitted.

The coefficient update processor 201a and the multiplier 201b in the first update filter 201 perform a coefficient update on a filter coefficient sequence based on the following formula (33), using a first residual signal d_1(n) and a variable update step size μ_{opt}(n−1) obtained as a result of the last operation, and thereby obtain a filter coefficient sequence ĥ(n+1).

$$\hat{h}(n+1)=\hat{h}(n)+\mu_{opt}(n-1)\epsilon(n) \quad (33)$$

The first update filter 201 further performs a filtering process on an input signal x(n), using the updated filter coefficient sequence ĥ(n+1) which is obtained by the coefficient update in the above-described formula (33), and thereby generates a second estimated response signal ŷ_2(n). Furthermore, the subtracting unit 210c subtracts the second estimated response signal ŷ_2(n) from an observed response signal y'(n), thereby obtaining a second residual signal d_2(n).

In addition, the delay processor 202 provides a variable update step size μ_{opt}(n), output from the step size controller 103, to the first update filter 201 at the time of the next coefficient update. Note that at the time of n=0 which is the initial time point, some initial values are given. The adaptive equalizer 200 outputs a first estimated response signal ŷ_1(n) generated by the subtraction filter 101 as an output estimated response signal ŷ(n), and the first residual signal d_1(n) as an output residual signal d(n).

Figure 6:
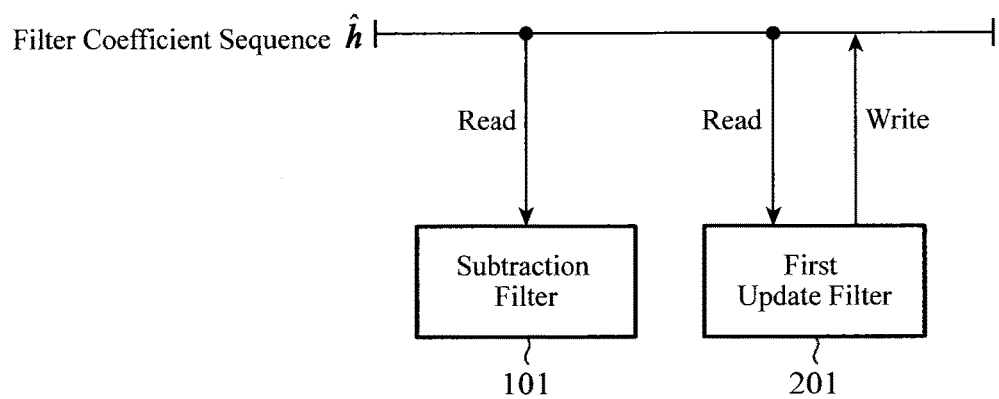
FIG. 6 is an illustrative diagram showing the process of reading/writing a filter coefficient sequence of the adaptive equalizer according to Embodiment 2.

FIG. 6 is an illustrative diagram schematically showing the process of writing or reading a filter coefficient sequence of the adaptive equalizer according to Embodiment 2.

In Embodiment 2, since the configuration is such that the delay processor 202 provides a variable update step size obtained in the last operation to the first update filter 201, a prior update filter coefficient sequence ĥ_{prio}(n) is not calculated, and thus, only the filter coefficient sequence ĥ(n) is to be stored in the memory unit 105. The subtraction filter 101 and the first update filter 201 read a filter coefficient sequence the ĥ(n) from the memory unit 105, and the first filter 201 further writes the updated filter coefficient sequence ĥ(n+1) into the memory unit 105.

As described above, according to the adaptive equalizer 200 of Embodiment 2, the configuration includes the step size controller 103 that determines a variable update step size μ_{opt}(n); a delay processor 202 that temporarily stores the variable update step size μ_{opt}(n) determined by the step size controller 103, and provides the variable update step size μ_{opt}(n) to the first update filter 201 at the time of the next coefficient update; and the first update filter 201 that performs a coefficient update on a filter coefficient sequence using the last variable update step size μ_{opt}(n−1) provided from the delay processor 202, and generates a second estimated response signal. Therefore, the adaptive equalizer can be configured with a smaller number of components and thus required computational resources are suppressed, enabling to achieve a reduction in the cost of the device.

Embodiment 3

In the above-described Embodiment 1, the configuration is shown in which in a first update filter 102, after performing a coefficient update on a prior update filter coefficient sequence using an input signal x(n) and an observed response signal y'(n), a second residual signal d_2(n) is immediately obtained using the same input signal x(n) and the same observed response signal y'(n), and the second residual signal d_2(n) is used for calculation of a variable update step size μ_{opt}(n).

However, an apparent correlation may temporarily strongly appear between an input signal x(n) with a limited length and a disturbance signal v(n). By this, there may be a case of outputting a second estimated response signal ŷ_2(n) in which a prior update filter coefficient sequence ĥ_{prio}(n)

removes a part of the disturbance signal v(n) contained in a provided observed response signal y'(n). In this case, an apparent variance $\sigma_{d2}^2(n)$ of a second residual signal $d_2(n)$ may temporarily become small. By this, there may be a case in which a variable update step size cannot be calculated accurately. Hence, in this Embodiment 3, a configuration is shown in which a residual signal is obtained for an input signal x(n) which is input after performing a coefficient update, and an observed response signal y'(n) to secure the accuracy of a variable update step size $\mu_{opt}(n)$ to be calculated.

Figure 7:
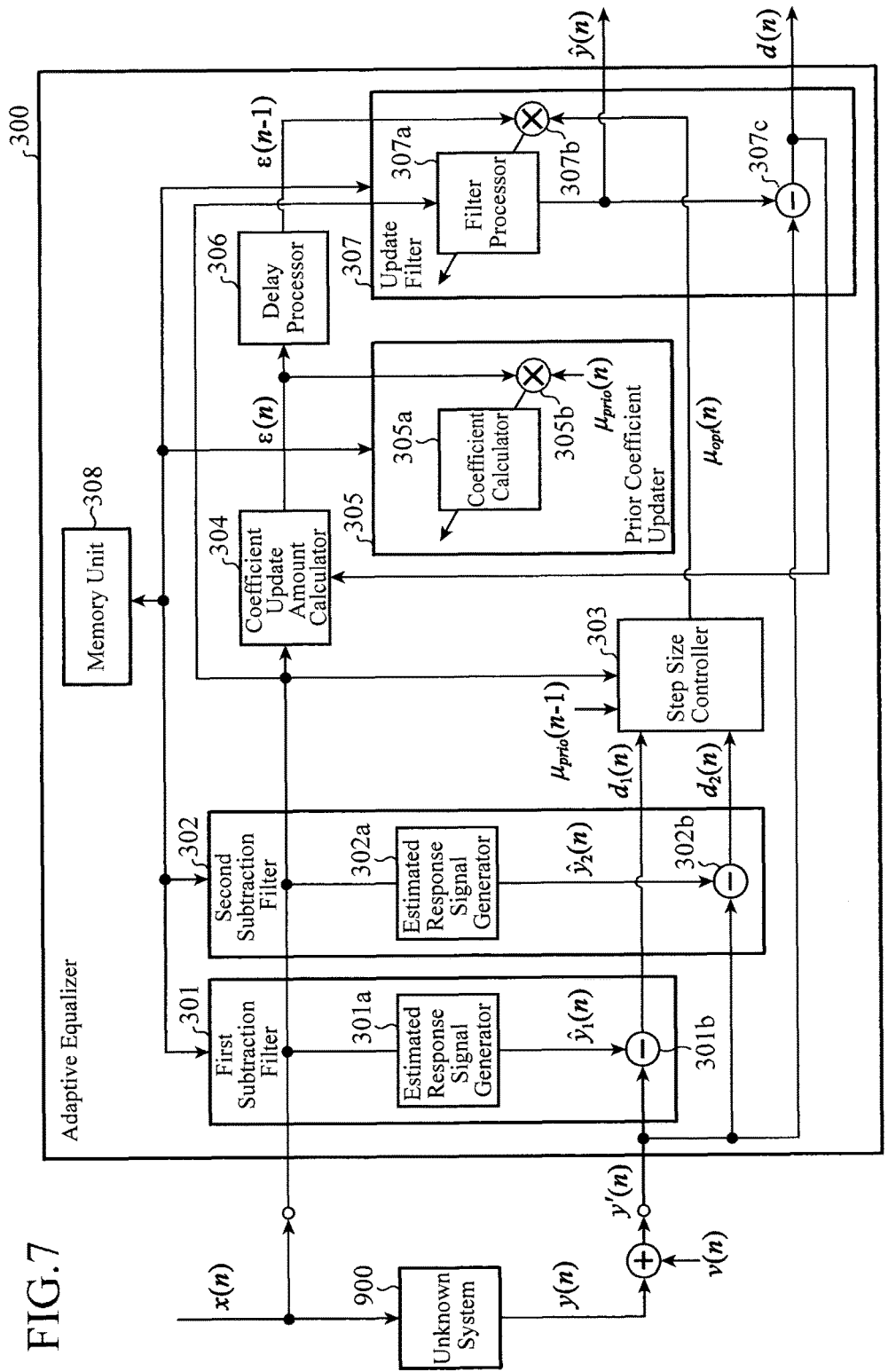
FIG. 7 is a block diagram showing a configuration of an adaptive equalizer according to Embodiment 3.

FIG. 7 is a block diagram showing a configuration of an adaptive equalizer according to Embodiment 3. In FIG. 7, an adaptive equalizer 300 is composed of: a first subtraction filter 301 that generates a first estimated response signal and a first residual signal; a second subtraction filter 302 that generates a second estimated response signal and a second residual signal; a step size controller 303 that determines a variable update step size; an coefficient update amount calculator 304 that calculates the amount of coefficient update; a prior coefficient updater 305 that calculates a prior update filter coefficient sequence; a delay processor 306 that provides the amount of coefficient update which is obtained in the last operation to an update filter 307; the update filter 307 that performs a coefficient update on a filter coefficient sequence; and a memory unit 308 that stores the filter coefficient sequence.

Furthermore, the first subtraction filter 301 includes an estimated response signal generator 301a and a subtractor 301b, the second subtraction filter 302 includes an estimated response signal generator 302a and a subtractor 302b, the prior coefficient updater 305 includes a coefficient calculator 305a and a multiplier 305b, and the update filter 307 includes a filter processor 307a, a multiplier 307b, and a subtractor 307c. In addition, the adaptive equalizer 300 is connected to an unknown system 900.

Figure 8:
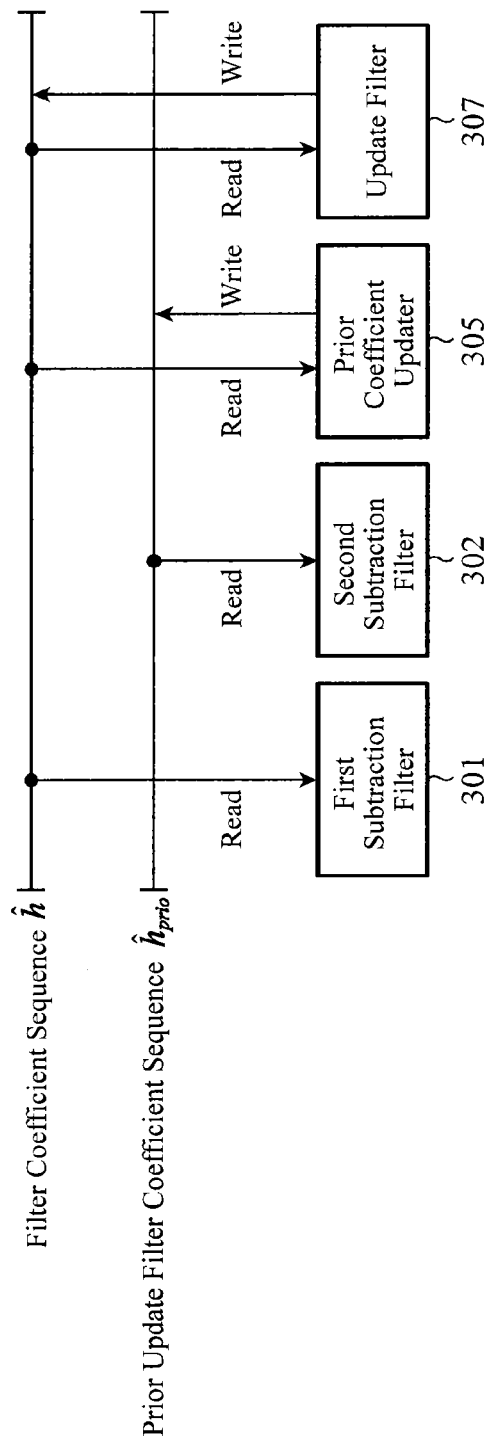
FIG. 8 is an illustrative diagram showing the process of reading/writing filter coefficient sequences of the adaptive equalizer according to Embodiment 3.

Next, the operation of the adaptive equalizer 300 according to Embodiment 3 will be described. FIG. 8 is an illustrative diagram schematically showing the process of reading or writing filter coefficient sequences of the adaptive equalizer according to Embodiment 3.

The first subtraction filter 301 refers to the memory unit 308 to read a filter coefficient sequence $\hat{h}(n)$ which is obtained in previous operations, and performs a filtering process on an input signal x(n) and thereby generates a first estimated response signal $\hat{y}_1(n)$, and subtracts the first estimated response signal j), (n) from an observed response signal y'(n) and thereby obtains a first residual signal $d_1(n)$. The second subtraction filter 302 refers to the memory unit 308 to read a prior update filter coefficient sequence $\hat{h}_{prio}(n)$ which is obtained in the last operation, and performs a filtering process on the input signal x(n) and thereby generates a second estimated response signal $\hat{y}_2(n)$, and subtracts the second estimated response signal $\hat{y}_2(n)$ from the observed response signal y'(n) and thereby obtains a second residual signal $d_2(n)$.

The step size controller 303 calculates a variable update step size $\mu_{opt}(n)$ based on the first residual signal $d_1(n)$, the second residual signal $d_2(n)$, and a prior update step size $\mu_{prio}(n-1)$ used last time. The calculation method is the same as that of Embodiment 1. In addition, as described in Embodiment 1, when the LMS algorithm, the affine projection algorithm, or the like, is used as an adaptive algorithm, an input signal x(n) is also used.

The update filter 307 updates the filter coefficient sequence $\hat{h}(n)$ based on the amount of coefficient update $\epsilon(n-1)$ obtained in the last operation and provided from the delay processor 306 and the variable update step size $\mu_{opt}(n)$, and thereby obtains the updated filter coefficient sequence $\hat{h}(n+1)$ shown in the following formula (34):

$$\hat{h}(n+1)=\hat{h}(n)+\mu_{opt}(n)\epsilon(n-1) \quad (34)$$

Note that the filter coefficient sequence $\hat{h}(n)$ used for the coefficient update is read from the memory unit 308, and the calculated filter coefficient sequence $\hat{h}(n+1)$ is written into the memory unit 308. Note that when n=0 at the initial time point, the amount of coefficient update has not been obtained and thus an update is not made and a filter coefficient sequence $\hat{h}(1)$ maintains an initial value $\hat{h}(0)$. In addition, the update filter 307 performs a filtering process on the input signal x(n) using the updated filter coefficient sequence $\hat{h}(n+1)$ and thereby generates an output estimated response signal $\hat{y}(n)$, and subtracts the output estimated response signal $\hat{y}(n)$ from the observed response signal y'(n) and thereby obtains an output residual signal d(n).

The coefficient update amount calculator 304 calculates the amount of coefficient update $\epsilon(n)$ from the input signal x(n) and the output residual signal d(n), based on a predetermined adaptive algorithm. The prior coefficient updater 305 refers to the memory unit 308 to read the filter coefficient sequence $\hat{h}(n+1)$ and calculates a prior update filter coefficient sequence $\hat{h}_{prio}(n+1)$ from the amount of coefficient update $\epsilon(n)$ and a prior update step size $\mu_{prio}(n)$ which is determined arbitrarily, based on the following formula (35):

$$\hat{h}_{prio}(n+1)=\hat{h}(n+1)+\mu_{prio}(n)\epsilon(n) \quad (35)$$

The calculated prior update filter coefficient sequence $\hat{h}_{prio}(n+1)$ is written into the memory unit 308. The delay processor 306 temporarily stores the amount of coefficient update $\epsilon(n)$ calculated by the coefficient update amount calculator 304 and provides the amount of coefficient update $\epsilon(n)$ to the update filter 307 at the time of the next coefficient update.

As described above, according to Embodiment 3, the configuration includes; the second subtraction filter 302 that obtains a second residual signal $d_2(n)$ from an input signal x(n) which is input after performing a coefficient update on a prior update filter coefficient sequence and an observed response signal y'(n); and the step size controller 303 that determines a variable update step size $\mu_{opt}(n)$ using the second residual signal $d_2(n)$. Thus, an apparent variance $\sigma_{d2}^2(n)$ of the second residual signal $d_2(n)$ is avoided from becoming small, by which a variable update step size $\mu_{opt}(n)$ can be calculated accurately.

Note that although in the above-described Embodiment 3 the configuration using the amount of coefficient update $\epsilon(n-1)$ obtained in the last operation is shown, this is not limited to the amount of coefficient update obtained in the last operation and can be appropriately changed. For example, a configuration using the amount of coefficient update $\epsilon(n-2)$ obtained in the operation before the last operation may be adopted.

Embodiment 4

When the disturbance condition or the convergence state of an adaptive equalizer varies for each frequency band, by applying an adaptive equalizer of the present invention to an adaptive filter algorithm using a time-frequency transform such as fast LMS and calculating, for each frequency band, a variable update step size according to a disturbance condition and a convergence state, a more efficient coefficient update can be expected to be performed. Hence, in this Embodiment 4, an exemplary configuration for the case of applying an adaptive filter algorithm using a time-frequency transform will be described.

Figure 9:
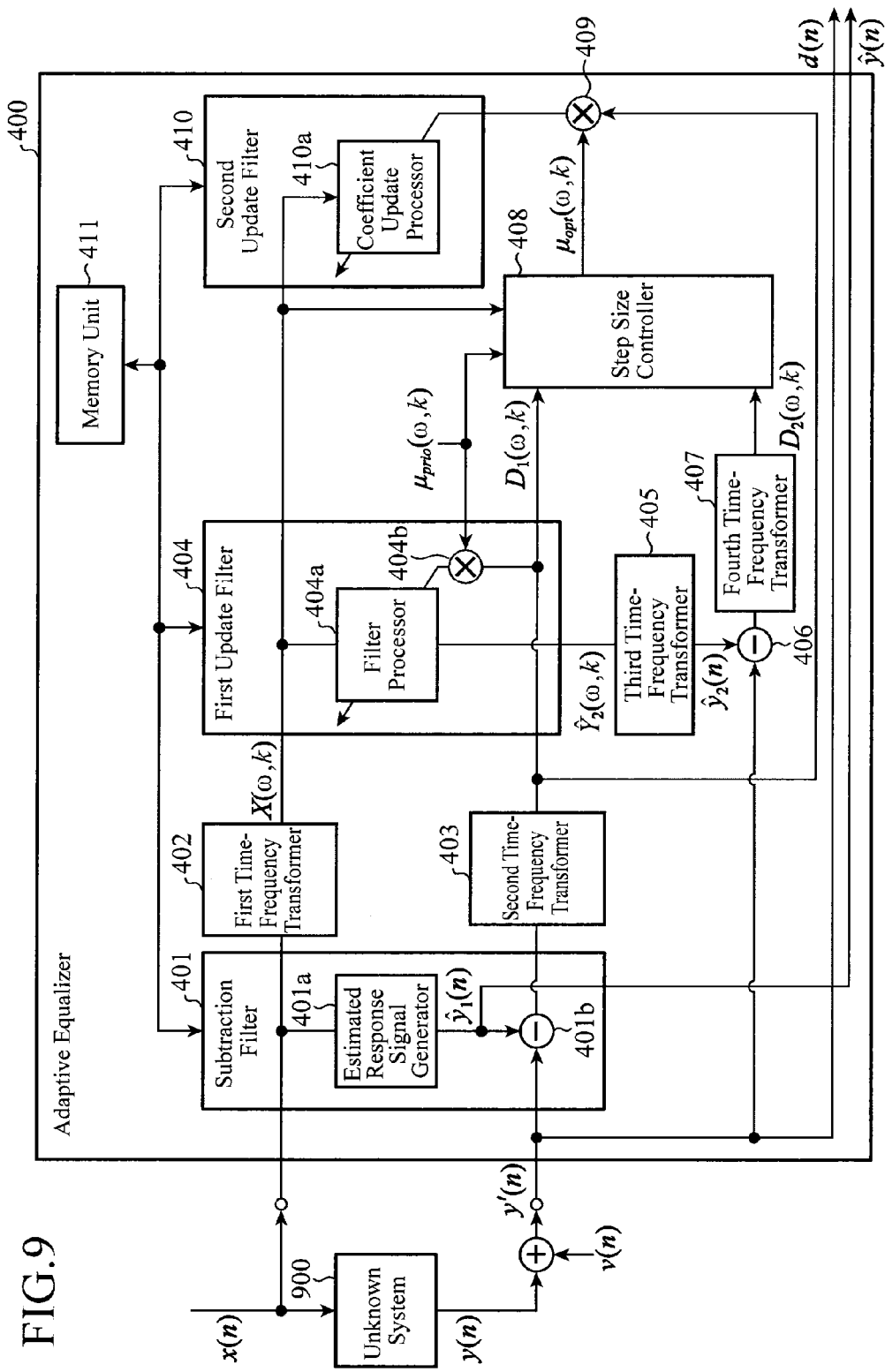
FIG. 9 is a block diagram showing a configuration of an adaptive equalizer according to Embodiment 4.

FIG. 9 is a block diagram showing a configuration of an adaptive equalizer according to Embodiment 4.

In FIG. 9, an adaptive equalizer 400 is composed of: a subtraction filter 401 that generates a first estimated response signal and a first residual signal; first and second time-frequency transformers 402 and 403; a first update filter 404 that performs a coefficient update on a filter coefficient sequence; third and fourth time-frequency transformers 405 and 407; a step size controller 408 that determines a variable update step size; a second update filter 410 that updates filter coefficients; a subtractor 406; a multiplier 409; and a memory unit 411 that stores the filter coefficient sequence. Furthermore, the subtraction filter 401 includes an estimated response signal generator 401a and a subtractor 401b, the first update filter 404 includes a filter processor 404a and a multiplier 404b, and the second update filter 410 includes a coefficient update processor 410a. In addition, the adaptive equalizer 400 is connected to an unknown system 900.

Figure 10:
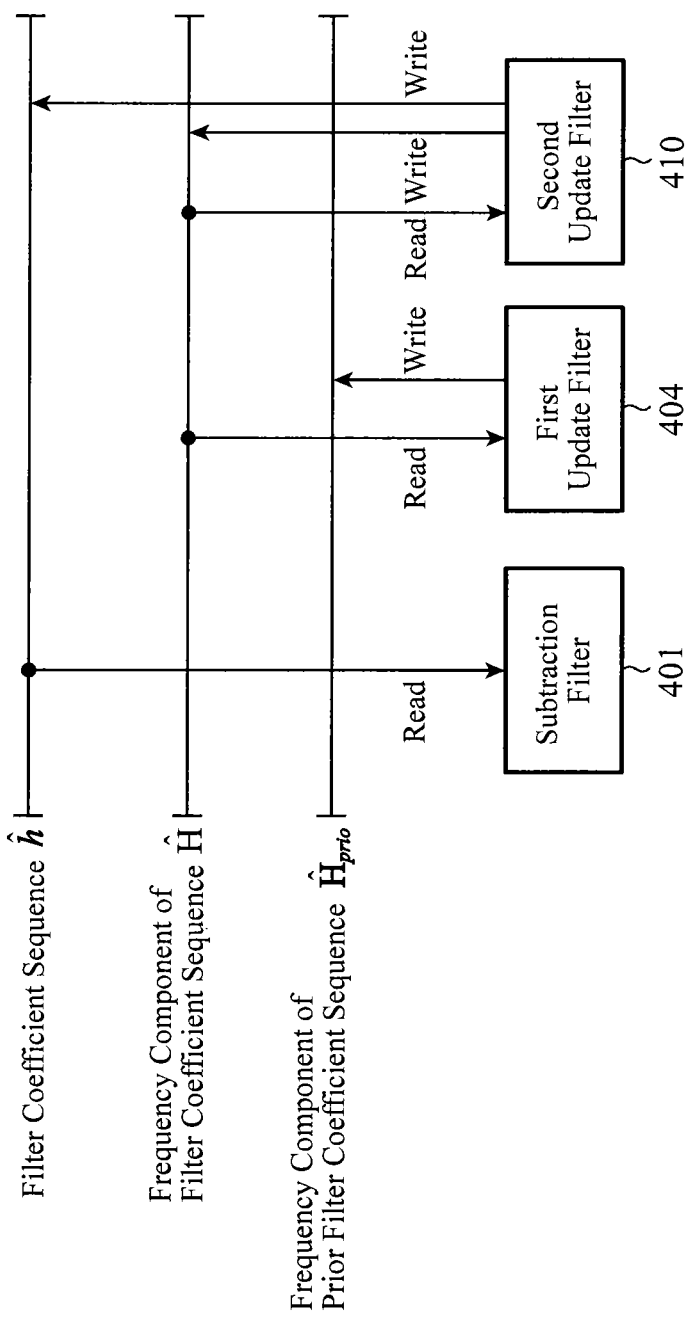
FIG. 10 is an illustrative diagram showing the process of reading/writing filter coefficient sequences of the adaptive equalizer according to Embodiment 4.

Next, the operation of the adaptive equalizer 400 of Embodiment 4 will be described. FIG. 10 is an illustrative diagram showing the process of reading or writing filter coefficient sequences of the adaptive equalizer of Embodiment 4.

The adaptive equalizer 400 of Embodiment 4 includes the first to fourth time-frequency transformers 402, 403, 405, and 407 that perform a time-frequency transform, and thus, performs a process such that a signal is decomposed on a predetermined block length L basis. In the following description, description is made assuming that the block number at the start time of a process is represented by k.

The subtraction filter 401 refers to the memory unit 411 to read a filter coefficient sequence ĥ(k) which is obtained in previous operations, and performs a filtering process on an input signal x(n) and thereby generates a first estimated response signal ŷ$_1$(n), and subtracts the first estimated response signal ŷ$_1$(n) from an observed response signal y'(n) and thereby obtains a first residual signal d$_1$(n). Note that the first estimated response signal ŷ$_1$(n) and the first residual signal d$_1$(n) are output as an output estimated response signal y(n) and an output residual signal d(n) of the adaptive equalizer 400.

The first time-frequency transformer 402 performs a time-frequency transform on the input signal x(n) on a block length L basis and thereby obtains a frequency component X(ω, k) of the input signal. Here, ω is a subscript representing frequency. For the time-frequency transform performed here, for example, the DFT (discrete Fourier transform) can be used. Likewise, the second time-frequency transformer 403 performs a time-frequency transform on the first residual signal d$_1$(n) and thereby obtains a frequency component D$_1$(ω, k) of the first residual signal.

The first update filter 404 reads a frequency component Ĥ(k) of the filter coefficient sequence which is obtained in previous operations, from the memory unit 411 using the frequency component X(ω, k) of the input signal, the frequency component D$_1$(ω, k) of the first residual signal, and an arbitrary prior update step size μ$_{prio}$(ω, k) which is determined for each frequency component, and updates the frequency component Ĥ(k) using a predetermined adaptive algorithm and thereby obtains the frequency component Ĥ$_{prio}$(k) of the prior update filter coefficient sequence, and writes the frequency component Ĥ$_{prio}$(k) into the memory unit 411. Note that as an example of such a frequency-domain adaptive equalizer, there is, for example, a fast LMS algorithm described in the following reference document 1. In addition to this, it is also possible to use an MDF (Multi Delay Filter) which is based on the fast LMS algorithm, etc.

Reference Document 1

S. Haykin, translated by Hiroshi Suzuki, et al., "Adaptive Filter Theory", Kagaku Gijutsu Shuppan, Inc., Jan. 10, 2001, pp. 500-514

The first update filter 404 further performs a filtering process on the frequency component X(ω, k) of the input signal using the frequency component Ĥ$_{prio}$(k) of the prior update filter coefficient sequence and thereby obtains a frequency component Ŷ$_2$(ω, k) of a second estimated response signal. The third time-frequency transformer 405 performs an inverse transform, from a frequency component to a time signal, on the frequency component Ŷ$_2$(ω, k) of the second estimated response signal, and thereby obtains a second estimated response signal ŷ$_2$(n). The first subtractor 406 subtracts the second estimated response signal ŷ$_2$(n) from the observed response signal y'(n) and thereby obtains a second residual signal d$_2$(n), and provides the second residual signal d$_2$(n) to the fourth time-frequency transformer 407. The fourth time-frequency transformer 407 performs a time-frequency transform on the second residual signal d$_2$(n) and thereby obtains a frequency component D$_2$(ω, k) of the second residual signal.

The step size controller 408 calculates, for each frequency component, a variable update step size μ$_{opt}$(ω, k) from the frequency component D$_1$(ω, k) of the first residual signal, the frequency component D$_2$(ω, k) of the second residual signal, and the prior update step size μ$_{prio}$(ω, k). Note that depending on the adaptive algorithm to be used, the frequency component X(ω, k) of the input signal is also used for the calculation. In the case of the above-described fast LMS algorithm, a variable update step size μ$_{opt}$(ω, k) can be determined, for example, as shown in the following formula (36):

$$\mu_{opt}(\omega, k) = \frac{1}{2}\mu_{prio}(\omega, k) + \frac{1}{2}\frac{1}{\mu_{prio}(\omega, k)}\frac{1}{|X(\omega, k)|^2}\left(1 - \frac{|D_2(\omega, k)|^2}{|D_1(\omega, k)|^2}\right) \quad (36)$$

Note that in the above-described formula (36), |D$_1$(ω, k)|$^2$ represents the magnitude of the frequency component D$_1$(ω, k) of the first residual signal and |D$_2$(ω, k)|$^2$ represents the magnitude of the frequency component D$_2$(ω, k) of the second residual signal. As such, an update step size according to a disturbance condition and a convergence state can be provided for each frequency component.

The second update filter 410 reads the frequency component Ĥ(k) of the filter coefficient sequence which is obtained in previous operations, from the memory unit 411 using the frequency component X(ω, k) of the input signal, the frequency component D$_1$(ω, k) of the first residual signal, and the variable update step size μ$_{opt}$(ω, k) which is determined for each frequency component. The second update filter 410 updates the frequency component Ĥ(k) by using a predetermined adaptive algorithm and obtains an updated frequency component Ĥ(k+1) of the filter coefficient sequence. In addition, a time-domain filter coefficient sequence ĥ(k+1) is calculated from the updated frequency component Ĥ(k+1) of the filter coefficient sequence, and both of the frequency component Ĥ(k+1) of the filter coefficient sequence and the time-domain filter coefficient sequence ĥ(k+1) are written into the memory unit 411. In the next operation, the filter coefficient sequence ĥ(k+1) is used by the subtraction filter 401, and the frequency component $\hat{H}(k+1)$ of the filter coefficient sequence is used by the first update filter 404 and the second update filter 410.

As described above, according to Embodiment 4, the configuration includes the first to fourth time-frequency transformers 402, 403, 405, and 407 that perform a time-frequency transform; the step size controller 408 that calculates, for each frequency component of an input signal, a variable update step size $\mu_{opt}(\omega, k)$ according to a disturbance condition and a convergence state; and the second update filter 410 that performs a coefficient update using the calculated variable update step size $\mu_{opt}(\omega, k)$. Thus, in the case in which the disturbance condition varies depending on the frequency band, for example, when there are a frequency band with a large disturbance and a frequency band with a small disturbance, an update step size with a small value is calculated for the frequency band with a large disturbance, enabling to suppress deterioration of a convergence state, and an update step size with a large value is calculated for the frequency band with a small disturbance, enabling to more rapidly reduce identification error.

In addition, according to Embodiment 4, the configuration includes the above-described frequency transformers 402, 403, 405, and 407, the step size controller 408, and the second update filter 410. Thus, when there are a frequency band where error has converged sufficiently and a frequency band where error has not converged sufficiently, since update step sizes appropriate for the respective frequency bands are provided, an unnecessary coefficient update can be suppressed for the frequency band where error has converged, and a coefficient update for the frequency band where error convergence is not sufficient can be rapidly performed.

Embodiment 5

In the above-described Embodiment 4, the configuration is shown in which a variable update step size is calculated for each frequency band using a time-frequency transform. In contrast, a configuration of Embodiment 5 is shown in which when high frequency resolution is not required. In this Embodiment 5, a variable update step size according to a disturbance condition and a convergence state is calculated for each sub-band by using a sub-band filter.

Figure 11:
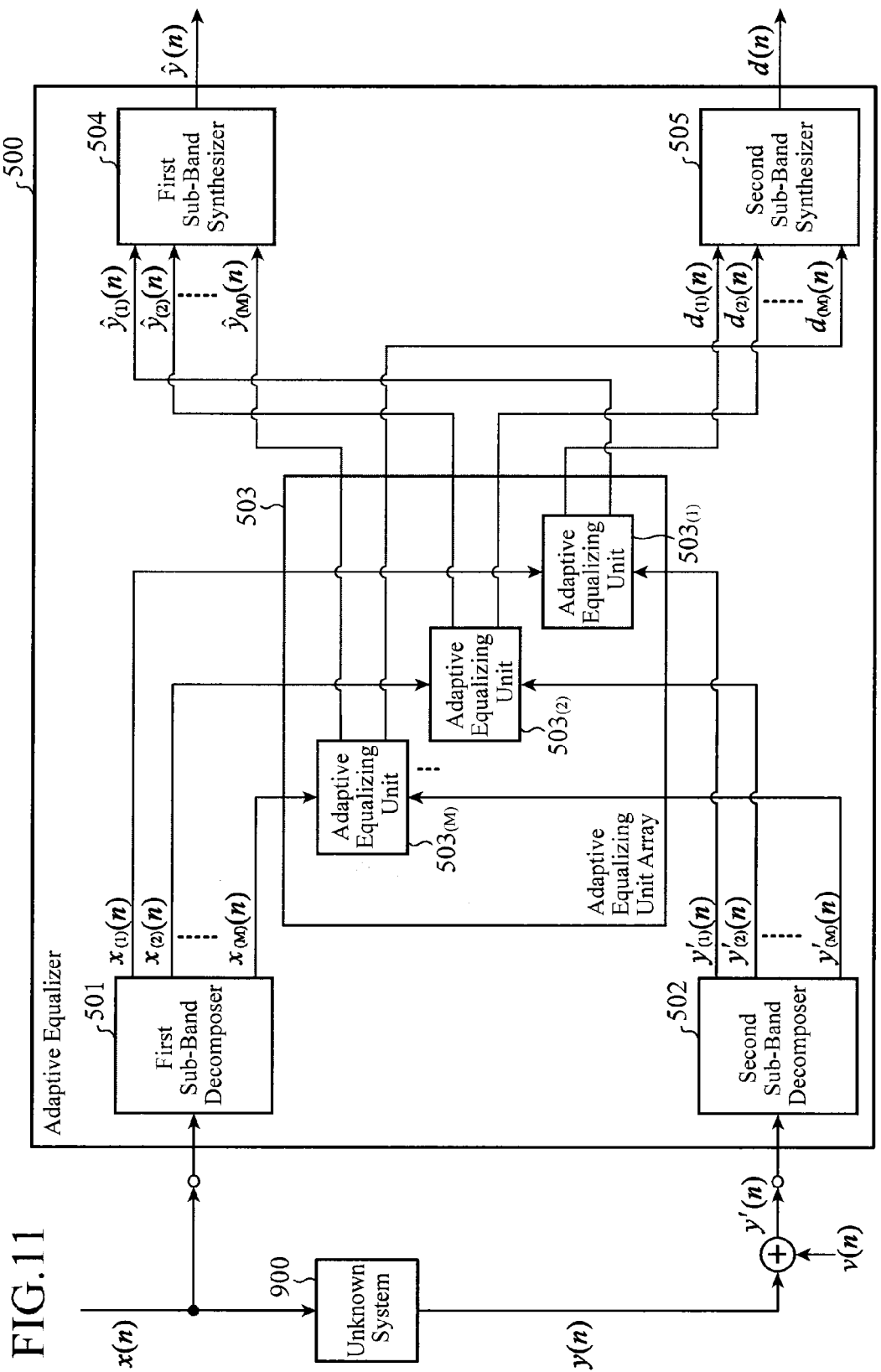
FIG. 11 is a block diagram showing a configuration of an adaptive equalizer according to Embodiment 5.

FIG. 11 is a block diagram showing a configuration of an adaptive equalizer of Embodiment 5. In FIG. 11, an adaptive equalizer 500 is composed of: a first sub-band decomposer 501; a second sub-band decomposer 502; an adaptive equalizing unit array 503 in which a plurality of adaptive equalizing units having functions shown in any of the above-described Embodiments 1-3 are arranged; a first sub-band synthesizer 504; and a second sub-band synthesizer 505. In addition, the adaptive equalizer 500 is connected to an unknown system 900.

The operation of the adaptive equalizer 500 of Embodiment 5 will be described.

The first sub-band decomposer 501 decomposes an input signal x(n) to the unknown system 900 into M frequency bands and thereby obtains sub-band decomposed input signals $x_{(1)}(n), x_{(2)}(n), \ldots, x_{(M)}(n)$. The "M" is a predetermined number of divisions. Likewise, the second sub-band decomposer 502 decomposes an observed response signal y'(n) into M frequency bands, and thereby obtains sub-band decomposed observed response signals $y'_{(1)}(n), y'_{(2)}(n), \ldots, y'_{(M)}(n)$.

The adaptive equalizing unit array 503 is composed of a group of adaptive equalizing units $503_{(1)}, 503_{(2)}, \ldots, 503_{(M)}$ (hereinafter, collectively referred to as the adaptive equalizing unit array 503) which support the M sub-bands, respectively. For the adaptive equalizing unit array 503 supporting the sub-bands, an adaptive equalizer described in any of the Embodiment 1-3 can be applied. Therefore, in the adaptive equalizing unit array 503, each of the adaptive equalizing units composing the adaptive equalizing unit array 503 performs a process on a corresponding one of M pairs of the sub-band decomposed input signal x(n) and observed response signal y'(n), thereby obtaining M sub-band decomposed output estimated response signals $\hat{y}_{(1)}(n), \hat{y}_{(2)}(n), \ldots, \hat{y}_{(M)}(n)$ and output residual signals $d_{(1)}(n), d_{(2)}(n), \ldots, d_{(M)}(n)$.

The first sub-band synthesizer 504 sub-band synthesizes the sub-band decomposed output estimated response signals $\hat{y}_{(1)}(n), \hat{y}_{(2)}(n), \ldots, \hat{y}_{(M)}(n)$ and thereby obtains an output estimated response signal $\hat{y}(n)$. Likewise, the second sub-band synthesizer 505 sub-band synthesizes the sub-band decomposed output residual signals $d_{(1)}(n), d_{(2)}(n), \ldots, d_{(M)}(n)$ and thereby obtains an output residual signal d(n).

As described above, according to Embodiment 5, the configuration includes the first and second sub-band decomposers 501 and 502 that divide an input signal x(n) and an observed response signal y'(n) into a plurality of number of divisions; and the adaptive equalizing unit array 503 composed of a plurality of adaptive equalizing units that calculate variable update step sizes for their corresponding band-decomposed signals and perform a coefficient update using the calculated variable update step sizes. Thus, even when the disturbance condition and the convergence state of identification error vary for each frequency band, identification error can be more rapidly reduced to a sufficiently small level.

Embodiment 6

Figure 12:
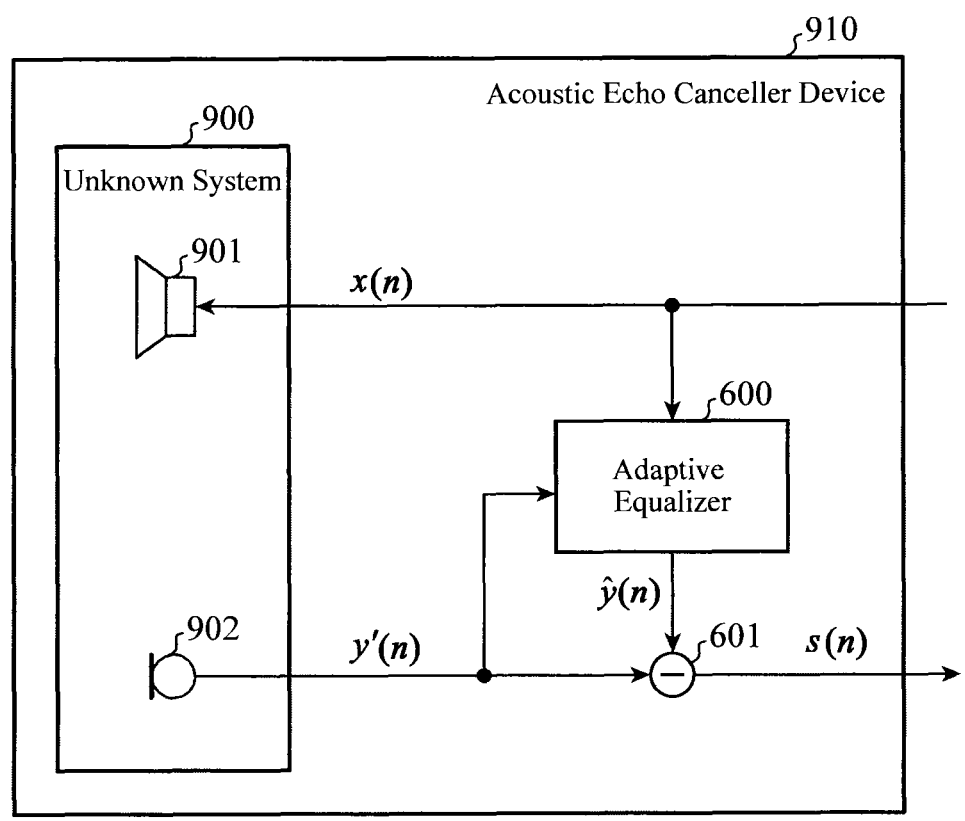
FIG. 12 is a block diagram showing a configuration of an acoustic echo canceller device according to Embodiment 6.

In this Embodiment 6, a preferred application example of an adaptive equalizer of the present invention to an acoustic echo canceller device is shown. FIG. 12 is a block diagram showing a configuration of an acoustic echo canceller device according to Embodiment 6.

The acoustic echo canceller device 910 includes an adaptive equalizer 600. For the adaptive equalizer 600, any of the adaptive equalizers described in the above-described Embodiments 1-5 can be applied. The acoustic echo canceller device 910 further includes a loudspeaker 901 that outputs a receive signal x(n); a microphone 902 that picks up user's conversation voice and converts the voice into a pickup signal y'(n); and a subtractor 601 which will be described later.

The loudspeaker 901 and the microphone 902 compose an unknown system 900. The receive signal x(n) is an input signal to the unknown system 900, and the pickup signal y'(n) is an output signal from the unknown system 900. Inside the unknown system 900, receiving voice output from the loudspeaker 901 is picked up as echo by the microphone 902. Other than this, the pickup signal y'(n) includes user's conversation voice and background noise in addition to echo.

The adaptive equalizer 600 identifies the transfer function of the unknown system 900 from the receive signal x(n) which is an input signal to the unknown system 900 and the pickup signal y'(n) which is an observed response signal of the unknown system 900, and outputs an output estimated response signal $\hat{y}(n)$ thereof. The subtractor 601 subtracts the output estimated response signal $\hat{y}(n)$ from the pickup signal y'(n) and outputs a transmit signal s(n). Since the output estimated response signal ŷ(n) is a signal that estimates echo, by the subtraction process by the subtractor 601, the transmit signal s(n) in which the echo is removed is obtained and thus the function of an acoustic echo canceller is achieved.

Here, the conversation voice and background sound included in the pickup signal y'(n) may become disturbances which hinder identification to the adaptive equalizer 600. In addition, there may be a case in which the transfer function of the unknown system 900 which is an echo path suddenly changes due to the movement of people or things in space around the loudspeaker 901 and the microphone 902, etc. However, as shown in the above-described Embodiments 1-5, even when there is a change in disturbance or the transfer function of the unknown system 900, the adaptive equalizer 600 performs a coefficient update process so as to efficiently reduce identification error, and thus, can increase the echo cancellation effect of the acoustic echo canceller device.

As described above, according to Embodiment 6, since the configuration is such that the adaptive equalizer 600 that performs a coefficient update process to efficiently reduce identification error is applied to an acoustic echo canceller device, the echo cancellation effect of the acoustic echo canceller device can be increased.

Embodiment 7

Figure 13:
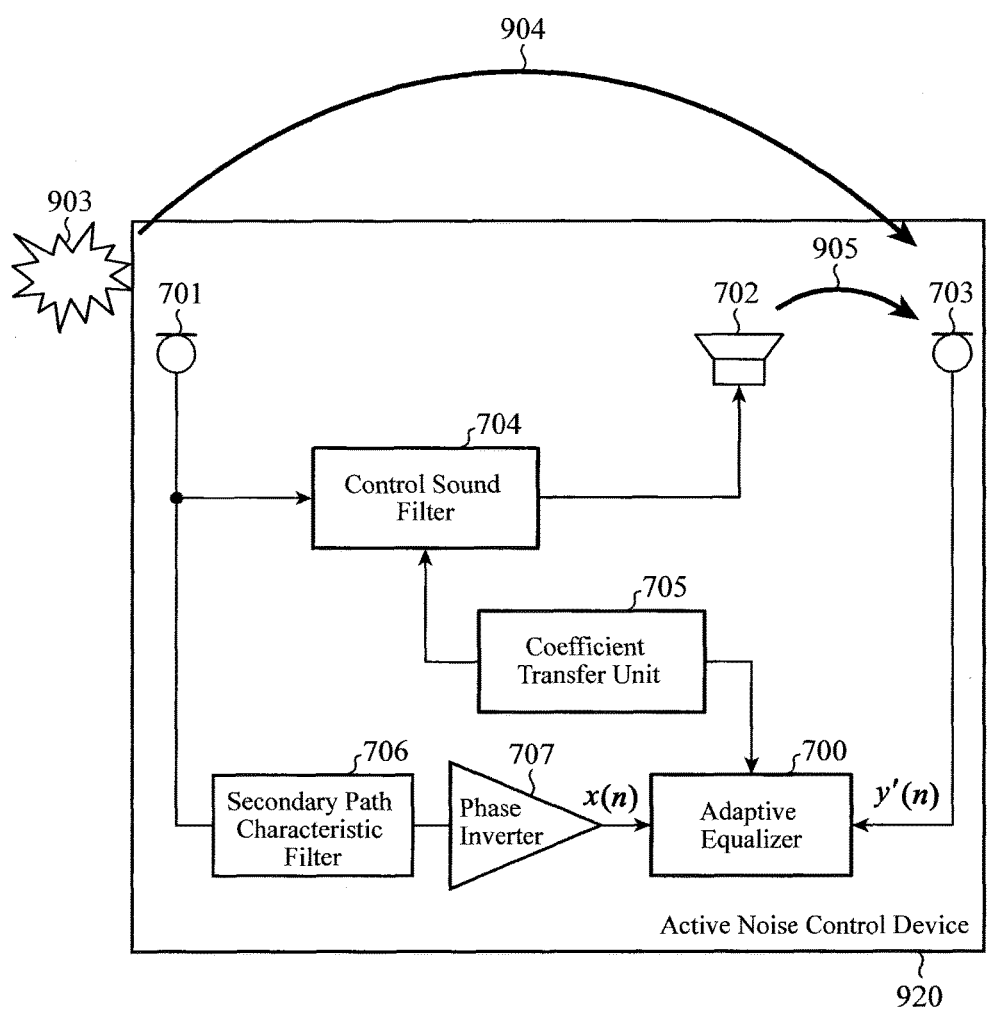
FIG. 13 is a block diagram showing a configuration of an active noise control device according to Embodiment 7.

In Embodiment 7, a preferred application example of an adaptive equalizer of the present invention to an active noise control device is shown. FIG. 13 is a block diagram showing a configuration of an active noise control device according to Embodiment 7.

This active noise control device 920 includes an adaptive equalizer 700. For the adaptive equalizer 700, any of the adaptive equalizers described in the above-described Embodiments 1-5 can be applied. The active noise control device 920 further includes: a reference microphone 701 placed near a noise source 903 which will be described later; a loudspeaker 702 that outputs a control sound for controlling noise; an error microphone 703 that is placed at a target location and observes noise at the location; a control sound filter 704 for generating a control sound; a coefficient transferring unit 705 that transfers a filter coefficient sequence ĥ(n) of the adaptive equalizer 700 to the control sound filter 704; a secondary path characteristic filter 706; and a phase inverter 707 that inverts the phase of a signal.

The noise source 903 indicates a noise generating source, a primary path 904 indicates a sound wave's path from the noise source 903 to the target location (in FIG. 13, the location where the error microphone 703 is placed), and a secondary path 905 indicates a sound wave's path from the loudspeaker 702 to the target location (in FIG. 13, the location where the error microphone 703 is placed).

The operation of the active noise control device 920 according to Embodiment 7 will be described.

Noise generated by the noise source 903 is picked up by the reference microphone 701 and becomes a reference signal. The reference signal is filtered by the secondary path characteristic filter 706 which imitates the transfer function of the secondary path 905, and is further phase-inverted by the phase inverter 707, becoming an input signal x(n). The input signal x(n) is input to the adaptive equalizer 700. In addition, the noise generated by the noise source 903 is picked up by the error microphone 703 through the primary path 904 and is input, as an observed response signal y'(n), to the adaptive equalizer 700. Note that incoming sound other than the noise originated from the noise source 903 is also picked up by the error microphone 703.

The adaptive equalizer 700 considers the input signal x(n) and the observed response signal y'(n) as an input signal and an observed response signal of an unknown system, respectively, and identifies the transfer function of the unknown system. The transfer function of the unknown system is represented by the following formula (37) when the transfer function of the primary path is G and the transfer function of the secondary path is C:

$$\text{Transfer function of the unknown system} = -G/C \tag{37}$$

It is known that the transfer function of the unknown system is an optimal transfer function of the control sound filter 704 in the active noise control device 920. The method of determining the transfer function of the control sound filter 704 in this manner is called a filtered-x method. The coefficient transferring unit 705 provides a filter coefficient sequence ĥ(n) representing the transfer function identified by the adaptive equalizer 700, to the control sound filter 704. The control sound filter 704 receives the above-described reference signal, performs filtering using the filter coefficient sequence ĥ(n) provided from the coefficient transferring unit 705, and outputs a control sound signal. The control sound signal is output from the loudspeaker 702 and is propagated to the target location through the secondary path 905. At the target location, the noise and the control sound become completely opposite in phase, by which they cancel each other out, reducing the noise.

In the case in which when the adaptive equalizer 700 identifies the above-described unknown system, sound other than target noise is mixed in a signal to be picked up by the error microphone 703, this sound becomes a disturbance and hinders the identification and becomes a factor of reducing the noise reduction effect of the active noise control device. In addition, when the transfer function of the primary path 904 is changed, the need arises for the adaptive equalizer 700 to perform further identification until identification error becomes sufficiently small. Furthermore, if the change in the transfer function of the primary path 904 is stationary, then the adaptive equalizer 700 needs to always follow this.

However, by applying any of the adaptive equalizers of the above-described Embodiments 1-5 of the invention as the adaptive equalizer 700, a transfer function is accurately identified against a disturbance, and when a change occurs in transfer function, the change can be followed rapidly, enabling to increase the noise reduction effect of the active noise control device 920.

As described above, according to Embodiment 7, the configuration includes the adaptive equalizer 700 that calculates a filter coefficient sequence; and the control sound filter 704 that filters, using the filter coefficient sequence, a reference signal which is obtained by picking up sound by the reference microphone 701, and outputs a control sound signal from the loudspeaker 702, by which a control sound and noise are cancelled each other out. Thus, even when other disturbances than target noise enter the error microphone, the noise reduction effect can be increased.

In addition, according to Embodiment 7, the configuration includes the adaptive equalizer 700 that identifies a transfer function such that a change in the transfer function of the primary path is rapidly followed. Thus, even when the transfer function of the primary path changes, the noise reduction effect can be increased.

Note that the invention of the present application allows free combinations of Embodiments, or modifications to any component in Embodiments, or omission of any components in Embodiments within the scope of the invention.

As described above, adaptive equalizers, an acoustic echo canceller device, and an active noise control device according to the invention are configured to be able to rapidly reduce identification error to a sufficiently small level, and thus, can be used as an adaptive equalizer used for learning identification of an unknown system, and an acoustic echo canceller device and an active noise control device that use the adaptive equalizer.

The invention claimed is:

1. An adaptive equalizer that generates an output signal by performing a filtering process on an input signal using an adaptive filter coefficient sequence having been subjected to a coefficient update process using a variable update step size,
    wherein the variable update step size is determined based on a magnitude ratio between or a magnitude difference between:
        a first residual signal obtained by using a first estimated response signal which is obtained through a filtering process on the input signal using a filter coefficient sequence, the filter coefficient sequence having been obtained in previous operations of the adaptive equalizer; and
        a second residual signal obtained by using a second estimated response signal which is obtained through a filtering process on the input signal using a prior update adaptive filter coefficient sequence, the prior update adaptive filter coefficient sequence being obtained by updating the filter coefficient sequence used for obtaining the first estimated response signal with a prior update step size.

2. The adaptive equalizer according to claim 1, wherein the second residual signal is a plurality of residual signals obtained by using a plurality of prior update adaptive filter coefficient sequences, the plurality of prior update adaptive filter coefficient sequences being obtained by performing coefficient updates with different prior update step sizes on the adaptive filter coefficient sequence having been obtained in previous operations of the adaptive equalizer, and
    the variable update step size is determined based on a magnitude ratio or magnitude difference between at least two residual signals selected from the first residual signal and the plurality of second residual signals.

3. The adaptive equalizer according to claim 1, wherein the determination of the variable update step size is performed by using the prior update step size as additional information.

4. The adaptive equalizer according to claim 1, wherein the input signal is a signal to be input to an unknown system being a target of learning identification, and
    the determination of the variable update step size is performed by using the input signal as additional information.

5. The adaptive equalizer according to claim 1, wherein the variable update step size is determined to be any of values in a predetermined range, the predetermined range being determined based on the first residual signal and the second residual signal.

6. The adaptive equalizer according to claim 3, wherein the variable update step size is determined to be any of values in a predetermined range, the predetermined range being determined based on the first residual signal, the second residual signal and the prior update step size.

7. The adaptive equalizer according to claim 1, wherein the adaptive equalizer calculates variances or average power with respect to each of the first residual signal and/or the second residual signal in a predetermined signal block length basis through a block adaptive algorithm that performs the coefficient update on the predetermined signal block length basis, and
    the determination of the variable update step size is performed by using the variances or average power as additional information.

8. The adaptive equalizer according to claim 1, wherein the prior update step size is a variable update step size obtained in previous operations.

9. The adaptive equalizer according to claim 3, wherein the variable update step size is determined for each frequency component by using the first residual signal and the second residual signal having been subjected to a frequency transform, and the prior update step size.

10. The adaptive equalizer according to claim 1, comprising:
    a subtraction filter that generates a first estimated response signal by performing a filtering process on the input signal using the adaptive filter coefficient sequence obtained in previous operations, and generates the first residual signal by subtracting the generated first estimated response signal from an observed response signal obtained by adding a disturbance to a response signal of the unknown system to the input signal;
    an update filter that calculates a prior update filter coefficient sequence by performing, using the first residual signal generated by the subtraction filter and the prior update step size, a coefficient update on the adaptive filter coefficient sequence obtained in previous operations of the adaptive equalizer, generates a second estimated response signal by performing a filtering process on the input signal using the calculated prior update filter coefficient sequence, and generates the second residual signal by subtracting the second estimated response signal from the observed response signal; and
    a step size controller that determines the variable update step size from at least the first residual signal generated by the subtraction filter, the second residual signal generated by the update filter, and the prior update step size.

11. The adaptive equalizer according to claim 10, wherein the update filter generates a plurality of second estimated response signals by performing a filtering process on the input signal using a plurality of prior update filter coefficient sequences calculated using a plurality of prior update step sizes, and generates a plurality of second residual signals by subtracting the plurality of second estimated response signals from the observed response signal, and
    the step size controller determines the variable update step size from at least two residual signals selected from the first residual signal and the plurality of second residual signals and the prior update step size.

12. The adaptive equalizer according to claim 10, further comprising a coefficient update filter that performs a coefficient update on the adaptive filter coefficient sequence by using the variable update step size.

13. The adaptive equalizer according to claim 1, comprising:
    a first subtraction filter that generates a first estimated response signal by performing a filtering process on the input signal using the adaptive filter coefficient sequence obtained in previous operations, and generates the first residual signal by subtracting the generated first estimated response signal from an observed response signal obtained by adding a disturbance to a response signal of the unknown system to the input signal;

a second subtraction filter that generates a second estimated response signal by performing a filtering process on the input signal using a prior update filter coefficient sequence obtained in previous operations, and generates the second residual signal by subtracting the generated second estimated response signal from the observed response signal;

a step size controller that determines the variable update step size from at least the first residual signal, the second residual signal, and the prior update step size;

a coefficient update filter that updates the adaptive filter coefficient sequence based on an amount of coefficient update obtained in previous operations and the variable update step size determined by the step size controller, generates an output estimated response signal by performing a filtering process on the input signal using the updated adaptive filter coefficient sequence, and obtains an output residual signal by subtracting the generated output estimated response signal from the observed response signal;

an coefficient update amount calculator that calculates the amount of coefficient update from the input signal and the output residual signal obtained by the coefficient update filter; and a prior coefficient updater that obtains, on a basis of the adaptive filter coefficient sequence updated by the coefficient update filter, the prior update filter coefficient sequence from the amount of coefficient update calculated by the coefficient update amount calculator and the prior update step size.

14. The adaptive equalizer according to claim 10, further comprising a time-frequency transformer that obtains frequency components by performing a frequency transform on the input signal, the first residual signal, and the second residual signal that change over time, wherein the step size controller determines, for each frequency component, a variable update step size based on frequency components of at least the first residual signal and/or the second residual signal having been subjected to the frequency transform in the time-frequency transformer and the prior update step size.

15. The adaptive equalizer according to claim 13, further comprising a time-frequency transformer that obtains frequency components by performing a frequency transform on the input signal, the first residual signal, and the second residual signal that change over time, wherein the step size controller determines, for each frequency component, a variable update step size based on frequency components of at least the first residual signal and/or the second residual signal having been subjected to the frequency transform in the time-frequency transformer and the prior update step size.

16. An adaptive equalizer that generates an output signal by performing a filtering process on an input signal using an adaptive filter coefficient sequence having been subjected to a coefficient update process using a variable update step size, the input signal being a signal to be input to an unknown system as a learning identification target, the adaptive equalizer comprising:

a sub-band decomposer that separates both the input signal and an observed response signal into sub-bands, the observed response signal being a response signal from the unknown system to the input signal, the response signal being influenced by disturbance;

an adaptive equalizing unit that
determines the variable update step size in proportion to a magnitude ratio between or a magnitude difference between a first residual signal and a second residual signal, the first residual signal being obtained by using a first estimated response signal which is obtained through a filtering process on the input signal using a filter coefficient sequence having been obtained in previous operations of the adaptive equalizer, the second residual signal being obtained by using a second estimated response signal which is obtained through a filtering process on the input signal using a prior update adaptive filter coefficient sequence, the prior update adaptive filter coefficient sequence being obtained by updating the filter coefficient sequence used for obtaining the first estimated response signal with a prior update step size, updates the adaptive filter coefficient sequence on a basis of the determined variable update step size, generates output estimated signals by performing, using the updated adaptive filter coefficient sequence, a filtering process on the input signals decomposed by the sub-band decomposer, and obtains output residual signals by subtracting the generated output estimated signals from the observed response signals; and a sub-band synthesizer that performs sub-band combination on the output residual signals obtained for each sub-band by the adaptive equalizing unit.

17. An acoustic echo canceller device comprising:

an adaptive equalizer according to claim 1 that identifies a transfer function of an unknown system based on an input signal and an observed response signal, and outputs an output estimated response signal that estimates a response signal of the unknown system, the unknown system being a learning identification target, the input signal being input to the unknown system; and a subtractor that subtracts the output estimated response signal output from the adaptive equalizer from the observed response signal, and outputs a transmit signal.

18. An acoustic echo canceller device comprising:

an adaptive equalizer according to claim 16 that identifies a transfer function of an unknown system based on an input signal and an observed response signal, and outputs an output estimated response signal that estimates a response signal of the unknown system, the unknown system being a learning identification target, the input signal being input to the unknown system; and a subtractor that subtracts the output estimated response signal output from the adaptive equalizer from the observed response signal, and outputs a transmit signal.

19. An active noise control device comprising:

an adaptive equalizer according to claim 1 that identifies a transfer function of an unknown system based on an input signal and an observed response signal, the input signal being input to the unknown system and being obtained by performing a filtering process and a phase inversion process on a reference signal obtained by collecting noise, the unknown system being a learning identification target;

a control sound filter that generates a control sound signal by performing a filtering process on the reference signal using a filter coefficient sequence representing the transfer function of the unknown system identified by the adaptive equalizer; and a speaker that outputs the control sound signal generated by the control sound filter, wherein the noise is cancelled out by the control sound signal output from the speaker.

20. An active noise control device comprising:

an adaptive equalizer according to claim 16 that identifies a transfer function of an unknown system based on an input signal and an observed response signal, the input signal being input to the unknown system and being obtained by performing a filtering process and a phase inversion process on a reference signal obtained by collecting noise, the unknown system being a learning identification target;

a control sound filter that generates a control sound signal by performing a filtering process on the reference signal using a filter coefficient sequence representing the transfer function of the unknown system identified by the adaptive equalizer; and a speaker that outputs the control sound signal generated by the control sound filter, wherein the noise is cancelled out by the control sound signal output from the speaker.

\* \* \* \* \*